United States Patent [19]

Shimoji

[11] Patent Number: 5,760,437
[45] Date of Patent: Jun. 2, 1998

[54] SEMICONDUCTOR MEMORY DEVICE, A METHOD FOR MANUFACTURING THEREOF AND A CONNECTING METHOD OF VIRTUAL GROUND ARRAY OF A SEMICONDUCTOR MEMORY DEVICE

[75] Inventor: Noriyuki Shimoji, Kyoto, Japan

[73] Assignee: Rohm Co., Ltd., Kyoto, Japan

[21] Appl. No.: 711,533

[22] Filed: Sep. 10, 1996

[30] Foreign Application Priority Data

Sep. 11, 1995 [JP] Japan .................. 7-232471

[51] Int. Cl.⁶ .................................. H01L 29/788
[52] U.S. Cl. .................. 257/316; 257/315; 257/317; 257/321; 365/185
[58] Field of Search .................. 257/314, 315, 257/316, 321; 365/185

[56] References Cited

U.S. PATENT DOCUMENTS

| 4,935,791 | 6/1990 | Namaki et al. ............ 257/316 |
| 4,949,305 | 8/1990 | Toyama et al. ............ 365/185 |
| 5,272,372 | 12/1993 | Kuzuhara et al. .......... 257/608 |
| 5,500,816 | 3/1996 | Kobayashi ............... 365/185 |
| 5,589,699 | 12/1996 | Araki .................... 257/316 |

Primary Examiner—Mahshid D. Saadat
Assistant Examiner—Valencia Martin Wallace
Attorney, Agent, or Firm—Merchant, Gould, Smith, Edell, Welter & Schmidt, P.A.

[57] ABSTRACT

An independent active region K42 is composed by consecutively providing the source region S42 and S53 of the memory cell MC42 and MC53 between the word line WL2, WL3. The memory cell MC42 and MC53 are connected to the word line WL2, WL3 respectively. Another independent active region K53 is composed by consecutively providing the drain region D53 and D64 of the memory cell MC53 and MC64 between the word line WL3, WL4. The bit line BL3 is formed by connecting each of the independent active regions K30, K31, K32 and K33 with polysilicon respectively. Each of the independent active regions include each of the drain regions D41, D42, D43 and D44 of the memory cells MC41, MC42, MC43 and MC44. Also, the bit line BL4 is formed by connecting each of the independent active regions K41, K42, K43 and K44 with polysilicon respectively. Each of the independent active regions comprises the source regions S41, S42, S43 and S44 respectively.

15 Claims, 19 Drawing Sheets

FIG.5

|  |  | WL1 | WL2 | WL3 | WL4 | BL0 | BL1 | BL2 | BL3 | BL4 | BL5 | BL6 | BL7 | Sub |
|---|---|---|---|---|---|---|---|---|---|---|---|---|---|---|
| (a) | WRITE | 0V | 0V | 12V | 0V | open | open | open | open | 0V | 6.5V | open | open | 0V |
| (b) | ERASE | *1 open | *1 open | 0V | *1 open | open | open | open | open | 12V | open | open | open | 0V |
| (c) | READ | 0V | 0V | 5V | 0V | 0V | 0V | 0V | 0V | 0V | 1V | open or 1V | 0V | 0V |

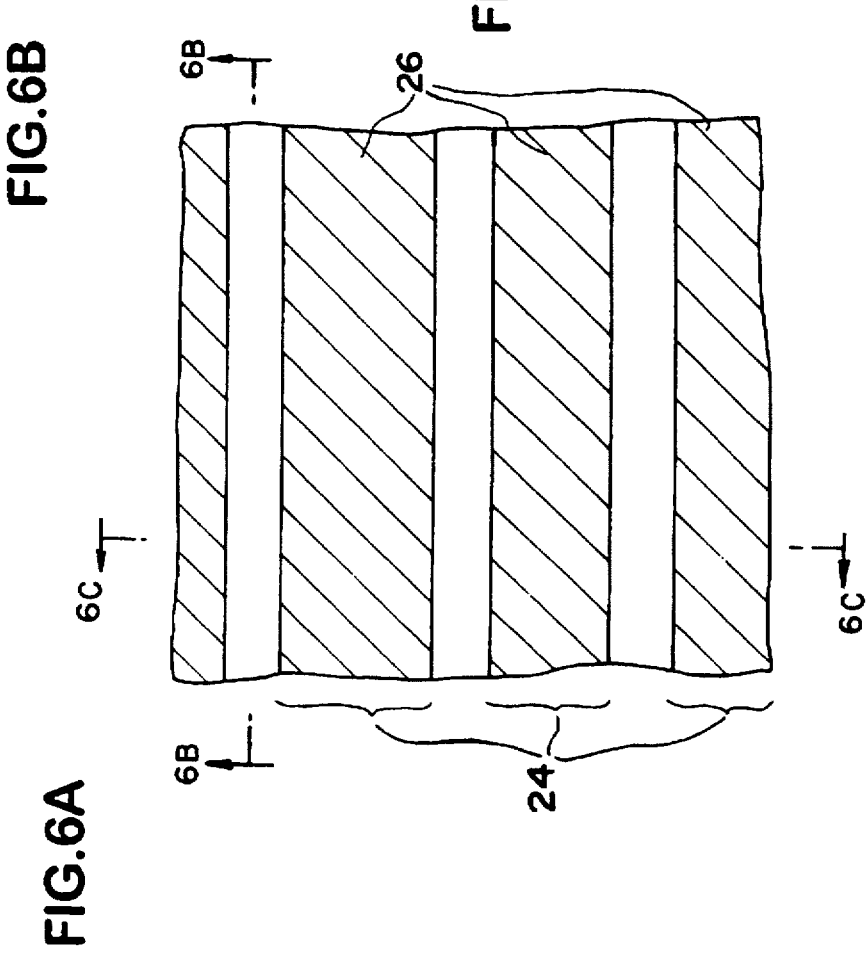
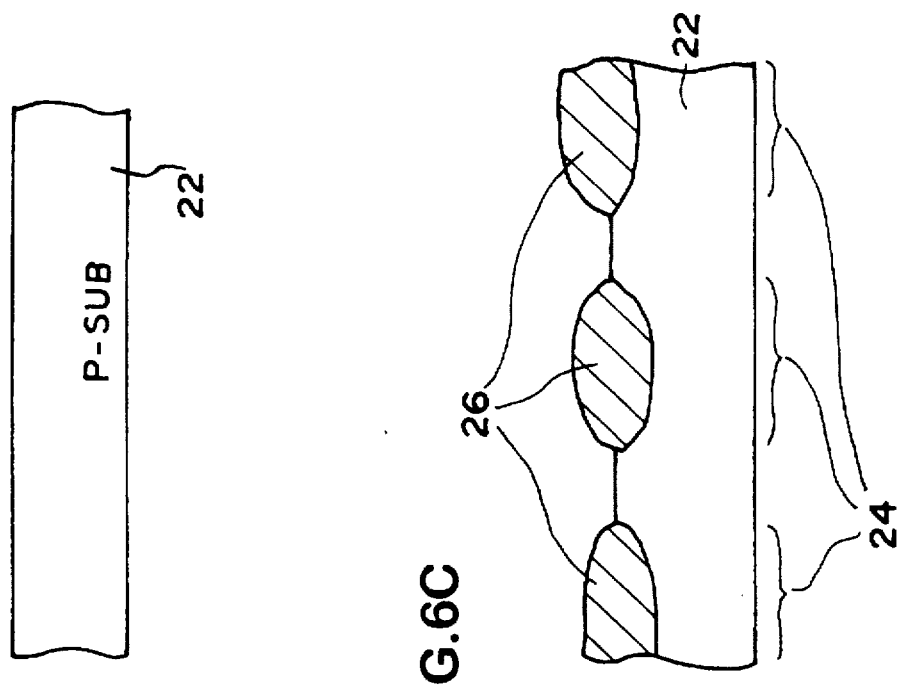
FIG.6A
FIG.6B
FIG.6C

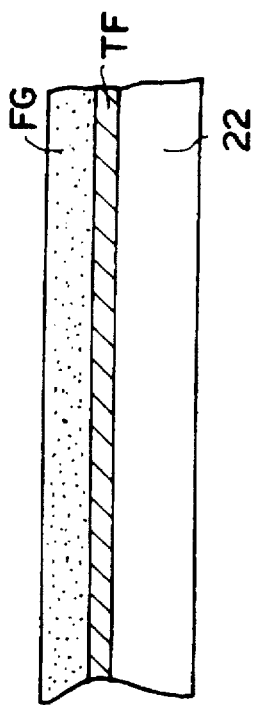
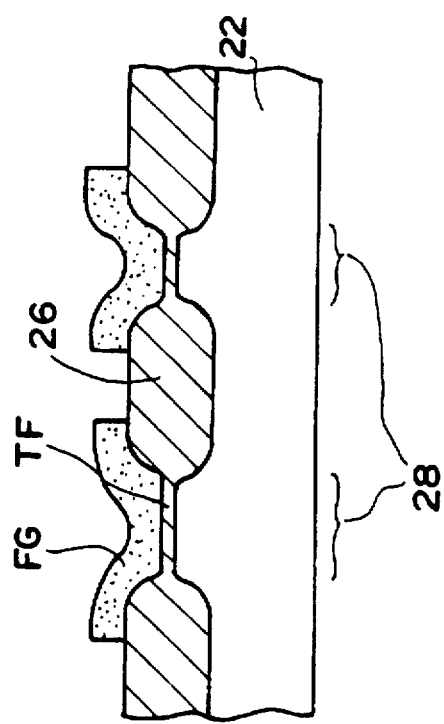
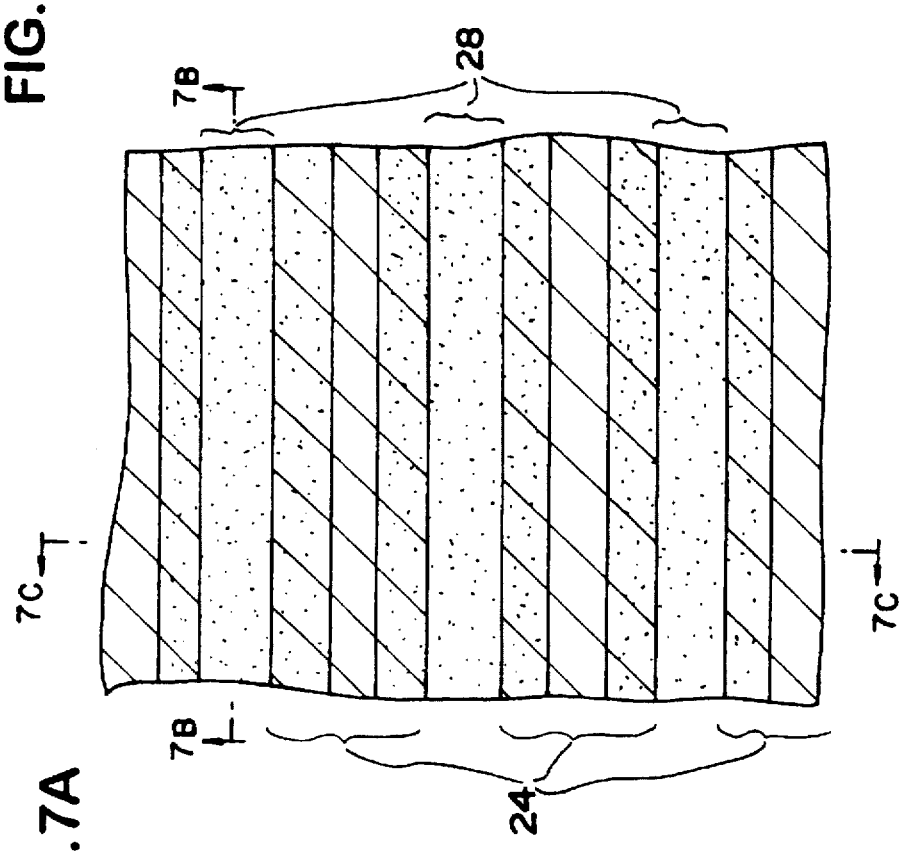
FIG.7B
FIG.7C
FIG.7A

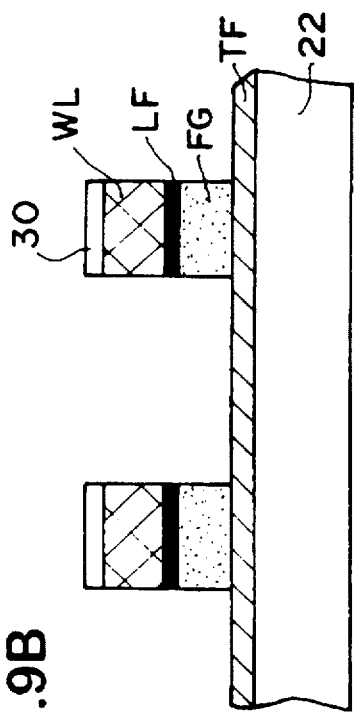
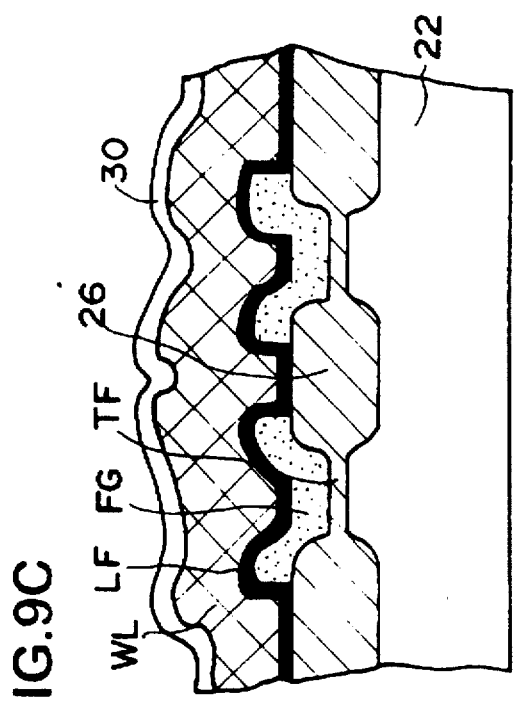
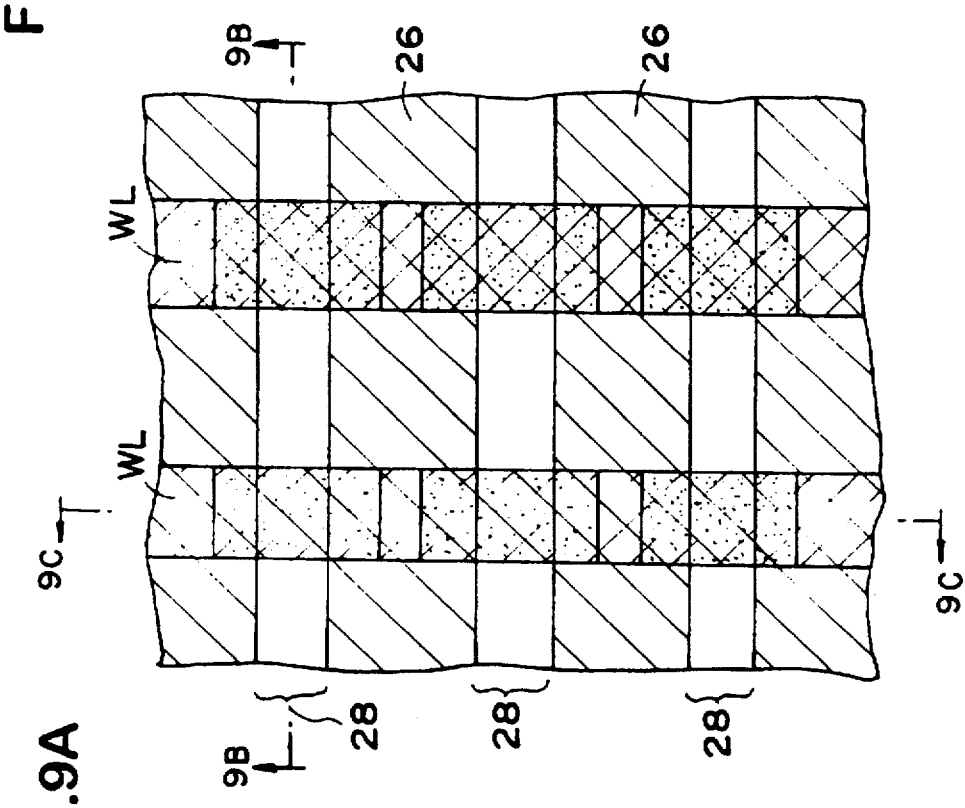
FIG.9A
FIG.9B
FIG.9C

FIG.15

| | WL1 | WL2 | WL3 | WL4 | BL0 | BL1 | BL2 | BL3 | BL4 | BL5 | BL6 | BL7 | Sub |
|---|---|---|---|---|---|---|---|---|---|---|---|---|---|
| (d) WRITE | open | open | -11V | open | open | open | open | open | open | 5V | open | open | 0V |
| (e) ERASE | 0V | 0V | 18V | 0V | 0V | 0V | 0V | 0V | 0V | 0V | 0V | 0V | 0V |
| (f) READ | open | open | 5V | open | open | open | open | open | 0V | 1V | open | open | 0V |

SEMICONDUCTOR MEMORY DEVICE, A METHOD FOR MANUFACTURING THEREOF AND A CONNECTING METHOD OF VIRTUAL GROUND ARRAY OF A SEMICONDUCTOR MEMORY DEVICE

BACKGROUND OF INVENTION

1. Field of the Invention

This invention relates to a semiconductor memory device, a method for manufacturing thereof and a connecting method thereof, more specifically a semiconductor memory device having ground array structure.

2. Description of the Prior Art

A floating gate type electrically erasable and programmable read only memory (hereinafter referred to as EEPROM) is generally used as an nonvolatile memory. The EEPROM is composed by arranging a plurality of memory cell MC shown in FIG. 16A and FIG. 16B in matrix configuration.

As shown in FIG. 16A, both a source S and a drain D are formed in an upper position of a semiconductor substrate 4. A tunnel oxidation layer TF, a floating gate FG, an inter layer LF and a control gate CG are accumulated one after another in that order on a channel region CH formed between the source S and the drain D. Each of the memory cells MC is composed by the elements stated in the above. FIG. 17A is a plane view showing structure of a conventional EEPROM 2. Also, FIG. 17B shows connections among the memory cells in the conventional EEPROM 2. As shown in FIG. 17A and FIG. 17B, control gate CG11, CG21 and CG31 of the memory cell MC11, MC21 and MC31 composing the first column of the EEPROM 2 are formed continuously to compose a word line WL1. And word lines WL1, WL2, WL3 and WL4 are composed in the same way.

Drain regions D11, D12, D13 and D14 of the memory cell MC11, MC12, MC13 and MC14 composing the first row, are connected to a bit line BL1. And the bit lines BL2, BL3 and BL4 are connected in the same way. All of source regions S11 to S34 are connected to the ground. For instance, following steps are carried out to write "1" in the memory cell MC23 of the EEPROM 2. A voltage of 12 V is applied exclusively to the word line WL3 shown in FIG. 17B, with applying a voltage of 6.5V exclusive to the bit line BL2.

By applying these voltages to the lines as shown in FIG. 16A, a part of electrons accelerated are trapped into the floating gate FG of the memory cells MC (MC23) by jumping over the tunnel oxidation layer TF. The state of the floating gate which traps the electrons is considered as "1". On the contrary, the state of the floating gate which does not trap the electrons is considered as "0". These states are maintained semi-permanently as long as not performing erasing or writing even after turning off the supply of electric power.

In order to erase the stored data in the memory cell 2, a voltage of 12 V is applied to a ground line GL with grounding only the word line WL3 shown in FIG. 17B.

As a result of application of the voltage, the electrons thus trapped into the floating gate FG of the memory cells MC (in this case, memory cell MC13, MC23 and MC33) are pulling out to the source region S by jumping over the tunnel oxidation layer TF as shown in FIG. 16B. So that, a state of the memory cells MC comes back to "0" state.

Hence, either of data writing or data erasing to the EEPROM 2 can be carried out.

However, the conventional EEPROM 2 has following problems need to be resolved. As shown in FIG. 17A, it is difficult for the conventional EEPROM 2 to shorten the length of a direction of "X", because the EEPROM 2 need to comprise an active region for connecting a plurality of source region located adjacently with one another in two columns such as the active region A23 connecting the source regions S12, S22 and S32 to the source regions S13, S23 and S33.

In addition, it is also difficult for the conventional EEPROM 2 to shorten the length of a direction of "Y", because the ground line GL (see FIG. 17B) for grounding the active regions A1, A23 and A4 must be provided between the bit line BL at a predetermined interval of bit (for instance every 16 bits). So that, a high-integrated EEPROM can not be realized.

In order to resolve the problems described in the above, an EEPROM 6 having virtual ground array structure has been proposed.

FIG. 18A is a plane view showing structure of the conventional EEPROM having virtual ground array structure. Also, FIG. 18B shows connection of the conventional EEPROM having virtual ground array structure. As shown in FIG. 18A and FIG. 18B, the control gate CG11, CG21 and CG31 of the memory cell MC11, MC21 and MC31 which form the first column of the EEPROM 6 are formed continuously so as to compose the word line WL1. The word lines WL1, WL2 and WL3 are composed in the same way.

The source regions S11, S12 and S13 of the memory cells MC11, MC12 and MC13 composing the first row, and the drain regions D21, D22 and D23 of the memory cell MC21, MC22 and MC23 composing the second row are formed on the same active region. The bit line BL2 is composed by the active region thus formed. The bit lines BL1, BL3 are composed in the same way.

Hence, the length of the direction of "X" in the EEPROM 6 having virtual ground array structure can be shorten because it is not necessary to provide the active regions A1, A23 and A4 between the word lines as the conventional EEPROM 2 shown in FIG. 17A and FIG. 17B. The length of the direction of "Y" in the EEPROM 6 can also be shorten, because the ground line GL does not need to be provided between the bit lines. So that, it is possible to realize the high-integrated EEPROM as desired.

However, the EEPROM 6 having virtual ground array structure offers following problems to be resolved. FIG. 19A is a sectional view, taken along the plane of line R—R of the memory cells MC (a memory cell MC31 shown in FIG. 18A) composing the EEPROM 6 shown in FIG. 18A.

As shown in FIG. 18A, both of the source region S and the drain region D of the memory cells MC are located right under the word line WL formed by connecting a plurality of the control gate CG. So that, both of the source region S and the drain region D are formed at first, then the tunnel oxidation layer TF, the floating gate FG, the inter layer LF and the control gate CG that is the word line are formed in the manufacturing process as shown in FIG. 19A.

Therefore, the heat added during the formation of above described layers may cause another thermal diffusion of the source region S and the drain region D both of which once formed by thermal diffusion of impurities. In order to secure proper operation of the EEPROM 6 which will be disturbed by the thermal diffusion, the space between the memory cells must be taken wider than it should be. As a result of that, the design work of the EEPROM is confined to realize high-integration.

Also, thickness of the part of the tunnel oxidation layer TF in contact with both of the source region S and the drain region D both of which having high impurity density become thicker, because the tunnel oxidation layer TF is formed after forming the source region S and the drain region D. So that, the electrons in the floating gate FG can not be pulled out to the source region S appropriately when erase operation is carried out.

To resolve the problems stated in the above, a memory cell 8 shown in FIG. 19B is proposed. The memory cell 8 is used for the memory cells MC shown in FIG. 19A in the EEPROM 6 shown in FIG. 18A and FIG. 18B. The memory cell 8 is formed as follows. Such as the tunnel oxidation layer TF, the floating gate FG, the inter layer LF and the control gate CG are formed, and then both of the source region S and the drain region D are formed by utilizing the layers formed previously as a mask.

Therefore, another thermal diffusion of the source region S and the drain region D does not occur. Also, alignment of the semiconductor device can be carried out precisely, because the source regions and the drain regions can be formed by a method of self-alignment. As a result of that, it is possible to realizes high-integration of the memory cell 8.

However, a problem still remains as described in below. In order to connect the control gate CG of each memory cell with each other, another process for forming a wiring layer which become the word line WL must be carried out. So that, the manufacturing cost is increased as a result of carrying out the additional manufacturing process.

Further to that, a high-speed data reading can not be achieved by the EEPROM 6 which has the structure shown in FIG. 18A because of high electrical resistivity caused by forming the bit line BL1, BL2, BL3 and BL4 with burried diffusion layers, regardless of using either of the memory cells MC (FIG. 19A), the memory cell 8 (FIG. 19B).

OBJECT AND SUMMARY OF THE INVENTION

An object of the present invention is to provide a semiconductor memory device, a method for manufacturing thereof and a connecting method of virtual ground array of a semiconductor memory device all of which resolve the problems of the semiconductor memory device such as the conventional EEPROM, that is to realize high-integration with achieving high-speed data reading as well as to reduce the manufacturing cost.

In accordance with characteristics of the present invention, a semiconductor memory device comprising a plurality of memory cell in a matrix configuration on a semiconductor substrate, wherein each of the memory cells comprises a source region, a drain region and a channel region formed between the source region and the drain region having a control gate located upward, wherein one word line is formed by connecting control gates of the memory cells composing a same column, and wherein one independent active region is formed between word lines located adjacently, the independent active region is composed by continuously providing one pair of followings, a pair of the source regions of two different memory cells, a pair of the drain regions of two different memory cells or a pair of the source region and the drain region of two different memory cells, and the two different memory cells are connected respectively to the word lines located adjacently, and wherein one bit line is formed by connecting the independent active regions with conductive substance, and the independent active regions include the source regions of the memory cells composing a same row, and wherein other one bit line is formed by connecting the independent active regions with conductive substance, and the independent active regions include the drain regions of the memory cells composing the same row, and wherein bit lines located adjacently of adjacent rows are used in common with one another.

Also, in accordance with characteristics of the present invention, a method for manufacturing a semiconductor memory device of claim 1, characterized in that a plurality of the independent active region are formed between the word lines located adjacently by using the word lines as a mask after forming the word lines, and wherein bit lines are formed by connecting the independent active regions with conductive substance.

Further, in accordance with characteristics of the present invention, a connecting method of virtual ground array for a semiconductor memory device, characterized in that a word line is formed by connecting control gates, and wherein a plurality of independent active region are provided between the word lines located adjacently, and each of the independent active regions are used in common with two memory cells connected respectively to the word lines located adjacently, and wherein a bit line is formed by connecting the independent active regions with conductive substance.

While the novel features of the invention are set forth in a general fashion, both as to organization and content, it will be better understood and appreciated, along with other objections and features thereof, from the following detailed description taken in conjunction with the drawings.

BRIEF DESCRIPTION OF THE DRAWINGS

FIG. 5 is a table showing voltages applied for performing write, erase and read operation of the EEPROM in an embodiment of the present invention.

FIGS. 6A, 6B and 6C are views illustrating a part of the manufacturing processes of the EEPROM in an embodiment of the present invention.

FIGS. 7A, 7B and 7C are views illustrating a part of the manufacturing processes of the EEPROM in an embodiment of the present invention.

FIGS. 9A, 9B and 9C are views illustrating a part of the manufacturing processes of the EEPROM in an embodiment of the present invention.

FIG. 15 is a table showing voltages applied for performing write, erase and read operation of the EEPROM in far still another embodiment of the present invention.

DETAILED DESCRIPTION OF THE PREFERRED EMBODIMENT

Figure 1:
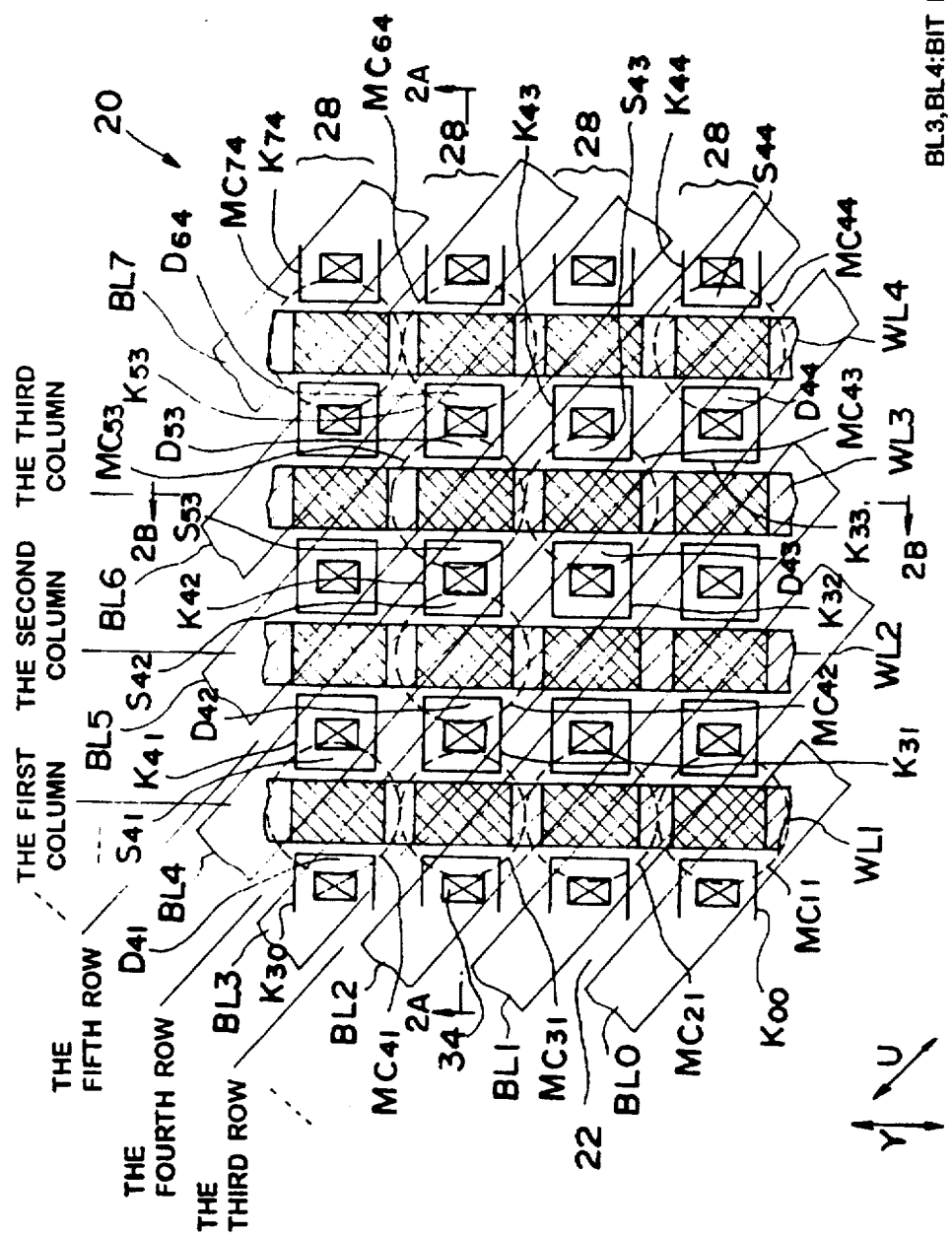
FIG. 1 is a plane view illustrating a planar structure of an EEPROM serves as a semiconductor memory device in an embodiment of the present invention.
Figure 2:
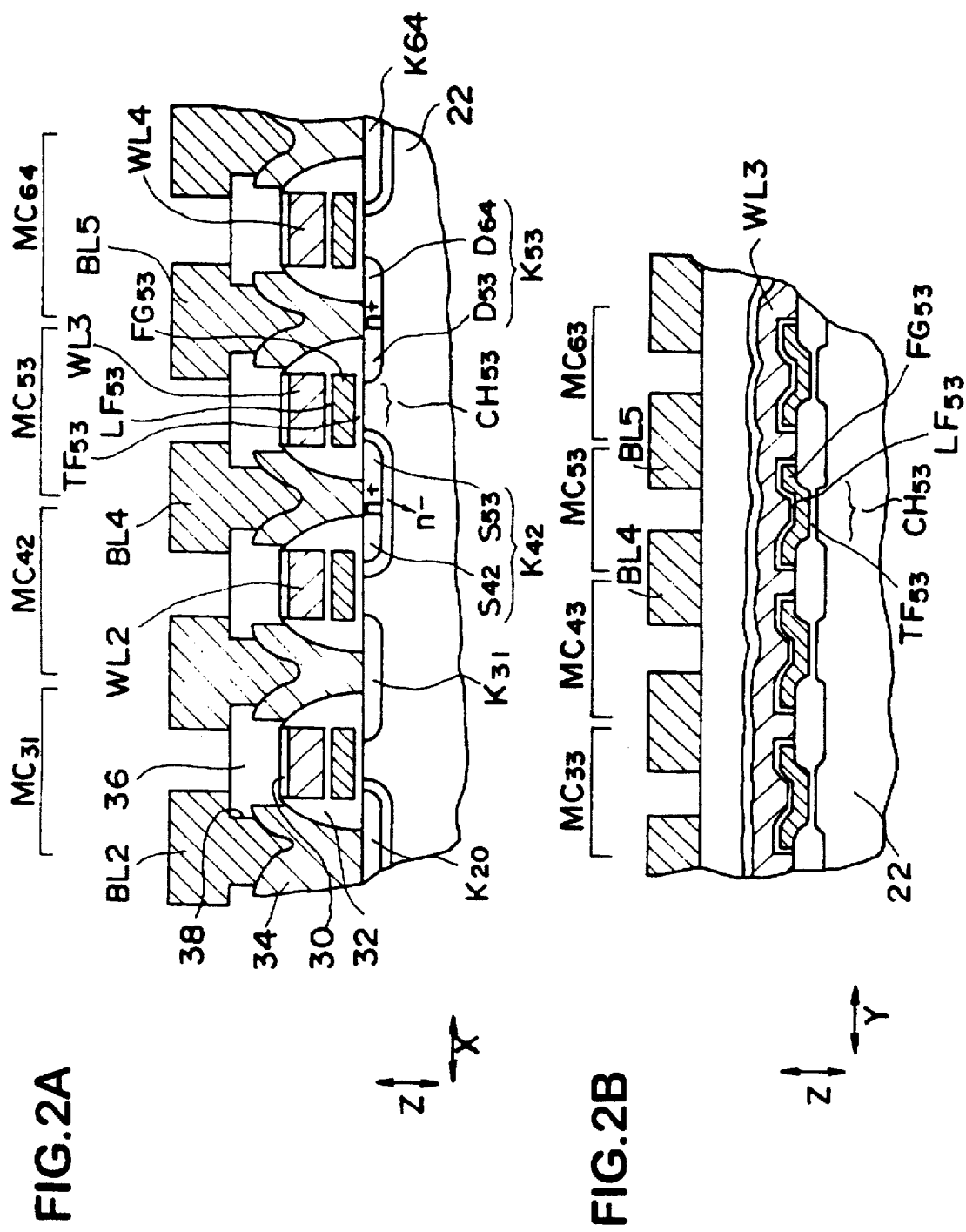
FIG. 2A is a sectional view, taken along the plane of line P—P of the EEPROM in an embodiment of the present invention.
FIG. 2B is a sectional view, taken along the plane of line Q—Q of the EEPROM in an embodiment of the present invention.

FIG. 1 is a plane view illustrating a planar structure of an EEPROM 20 as a semiconductor memory device in an embodiment of the present invention. FIG. 2A and FIG. 2B show sectional views of FIG. 1 in the plane of P—P and plane of Q—Q respectively. Also, FIG. 3 is a perspective view illustrating the EEPROM 20 shown in FIG. 1 schematically, and FIG. 4 is a view illustrating connections of FIG. 3.

The EEPROM 20 is composed by arranging a plurality of memory cell MC11 to MC74 on a semiconductor substrate 22 in matrix configuration. A total of 16 memory cells (MC11 to MC74) are arranged as 7 rows and 4 columns in matrix configuration in the embodiment shown in FIG. 1. The elements composing the columns in the matrix are arranged toward a direction of "Y", and the elements consist of the rows in the matrix are positioned toward a direction of "U".

Figure 3:
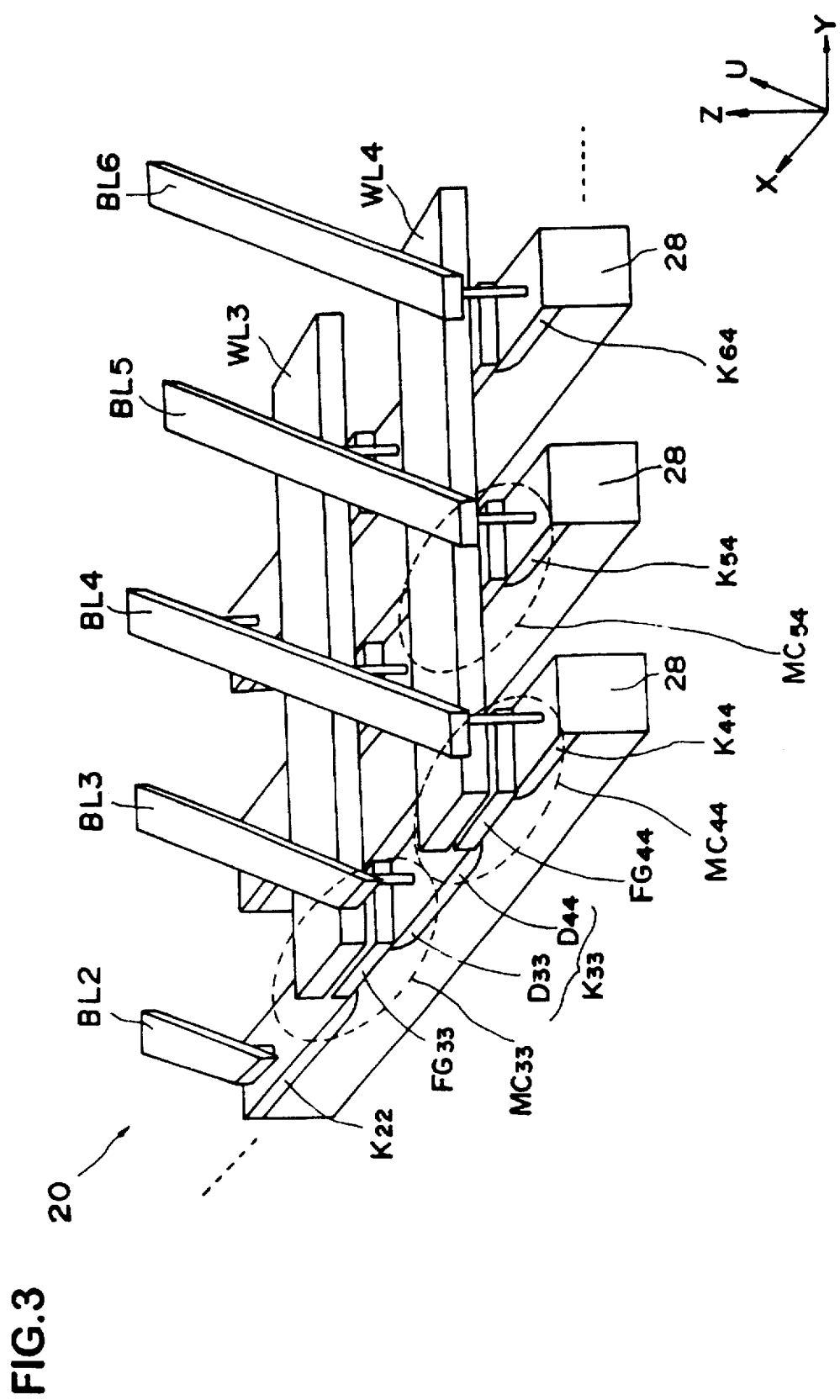
FIG. 3 is a perspective view illustrating the EEPROM in an embodiment of the present invention schematically.
Figure 4:
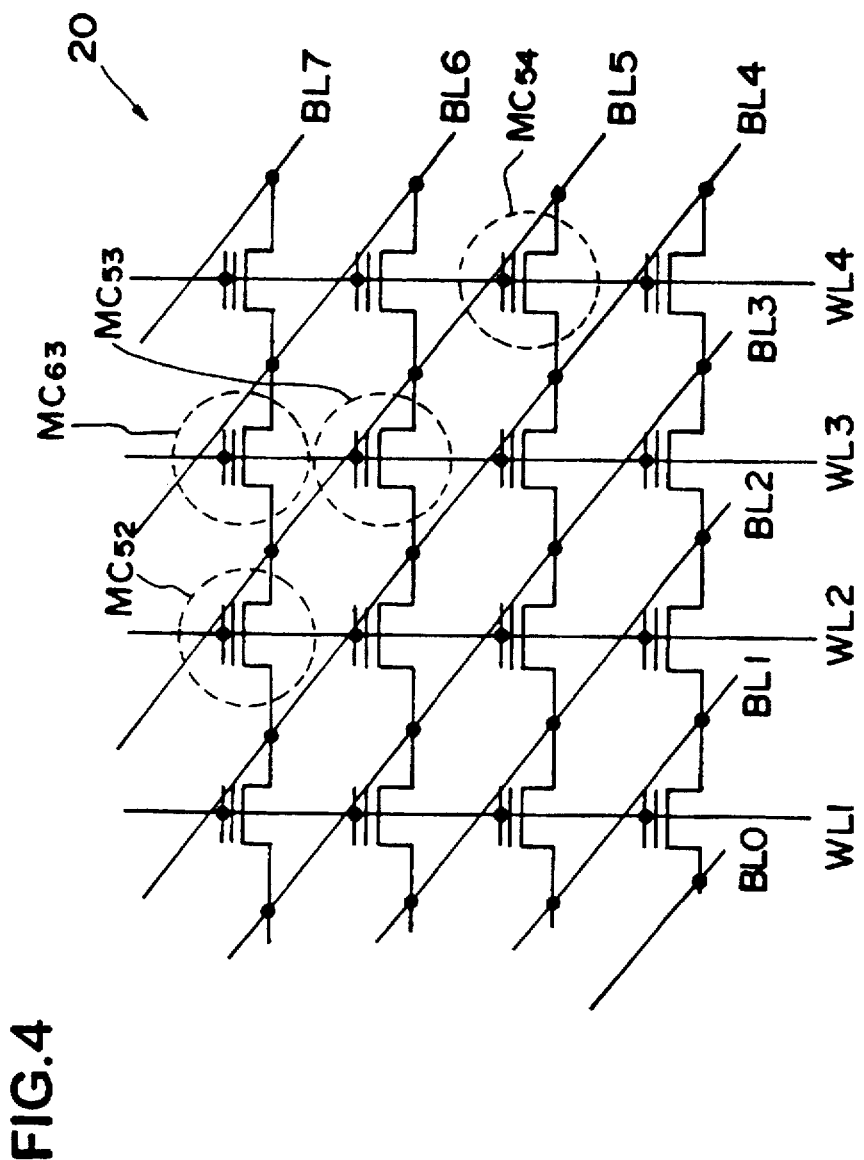
FIG. 4 is a view illustrating connections of the EEPROM in an embodiment of the present invention.

As shown in FIG. 3, each of device formation regions 28 is formed continuously in a line shape having longitude toward a direction of "X". The memory cells MC11 to MC 74 are formed on the device formation regions 28. So that, the elements composing the rows positioned toward a direction of "U" and the memory cells formed in a device formation region arranged toward the direction "X" intersect with each other. In other words, each of the memory cells composing one row is formed across the different device formation regions 28. The plane of P—P in FIG. 2A shows a sectional view for one of the device formation regions 28.

The structure of the memory cells MC11 to MC74 will be described in below using the memory cell MC53 as an example. As shown in FIG. 2A which illustrates P—P plane of FIG. 1, both a source region S53 and a drain region D53 are formed in an upper position of a semiconductor substrate 22. A tunnel oxidation layer TF53, a floating gate FG53, an inter layer LF53 and a word line WL3 used as control gates are accumulated one after another in that order on a channel region CH53 located between the source S53 and the drain D53. The memory cells MC53 is composed by these elements.

As shown in FIG. 2B which illustrates Q—Q plane of FIG. 1, the control gate of the memory cells MC33, MC43, MC53 and MC63 composing the third column are formed continuously as the word line WL3. And the word lines WL1, WL2 and WL4 are formed in the same way.

As shown in FIG. 2A, the source regions S42 and S53 of the memory cells MC42 and MC53 both of the memory cells being connected respectively to the word line WL2 and the word line WL3 are provided between the word lines continuously, and both of the source regions compose one independent active region K42. Further, the drain regions D53 and D64 of the memory cell MC53 and MC64 both of the memory cells being connected respectively to the word line WL3 and the word line WL4 are provided between the word lines continuously, and both of drain regions composing one independent active region K53. Thus, a total of 20 of the independent active regions K00 to K74 are formed in the embodiment described in FIG. 1.

As shown in FIG. 1, a bit line BL3 is formed by connecting independent active regions K30, K31, K32 and K33 with conductive materials such as polysilicon. Drain regions D41, D42, D43 and D44 of the memory cells MC41, MC42, MC43 and MC44 which compose the fourth row, are formed in the independent active regions K30, K31, K32 and K33. Since the independent active regions K31, K32 and K33 respectively include the drain regions D31, D32 and D33 of the memory cells MC31, MC32 and MC33 which compose the third row, the bit line BL3 is a line which connects the drain regions D31, D32 and D33 of the memory cells MC31, MC32 and MC33 one another which compose the third row.

Also, a bit line BL4 is formed by connecting independent active regions K41, K42, K43 and K44 with conductive materials. Source regions S41, S42, S43 and of the memory cells MC41, MC42, MC43 and MC44 which compose the fourth row, are formed in the independent active regions K41, K42, K43 and K44. As in the same manner of the bit line BL3, the bit line BL4 is a line which connects the source regions S52, S53 and S54 of the memory cells MC52, MC53 and MC54 one another which compose the fifth row. And the bit line BL0, BL1, BL2, BL5, BL6 and BL7 are composed in the same way.

Next, operation of the EEPROM 20 will be described in accordance with FIG. 5 referring to FIG. 4 which illustrates connection of the EEPROM 20. As shown in row (a) in FIG. 5, a high voltage of 12V is applied exclusively to the word line WL3, and a ground voltage of 0V is applied to other word lines WL1, WL2 and WL4 in order to write "1" to the memory cell MC53 located at the fifth row and third column shown in FIG. 4. In addition, a high voltage of 6.5V is applied to the bit line BL5, and the ground voltage of 0V is applied to the bit line BL4. During application of these voltages to the bit lines, other bit lines such as bit lines BL0, BL1, BL2, BL3, BL6 and BL7 are opened, as well as applying the ground voltage of 0V to the semiconductor substrate 22 (see FIG. 2A).

Figure 16A:
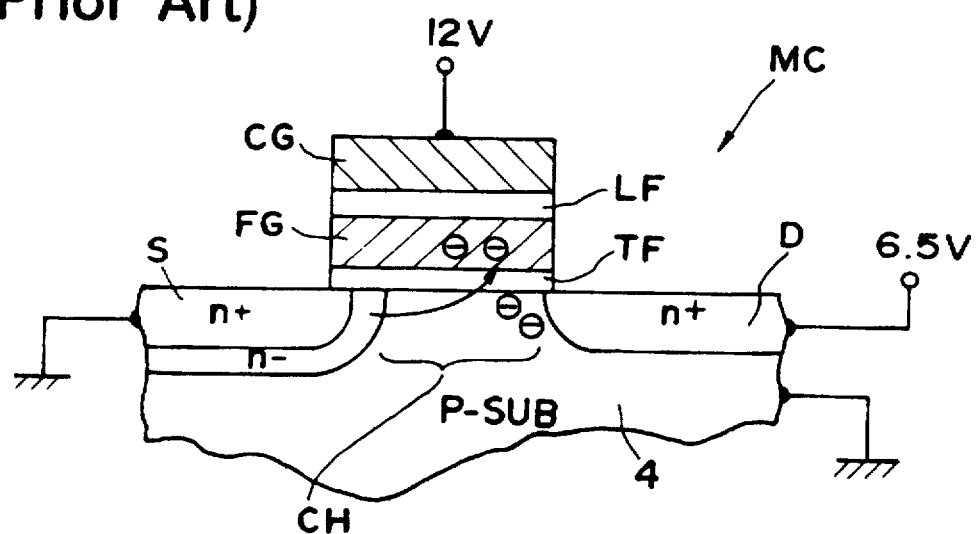
FIG. 16A and 16B are sectional views illustrating structure of the memory cells composing a conventional EEPROM.

As a result of the application of these voltages described in the above, a state of the memory cell MC53 becomes the same state as the memory cell MC shown in FIG. 16A. So that, a part of the accelerated electrons are trapped into the floating gate FG53 of the memory cells MC53 by jumping over the tunnel oxidation layer TF53 (see FIG. 2A). Hence, "1" is written in the memory cell MC53. Therefore, "1" can be written only in the memory cell MC53.

In order to erase "1" thus written in the memory cell MC53, the ground voltage of 0V is applied exclusively to the word line WL3, and other word lines WL1, WL2 and WL4 are opened as shown in row (b) in FIG. 5. In addition, a high voltage of 12V is applied to the bit line BL4, and the bit lines BL0, BL1, BL2, BL3, BL5, BL6 and BL7 are opened. Further, the ground voltage of 0V is applied to the semiconductor substrate 22.

Figure 16B:
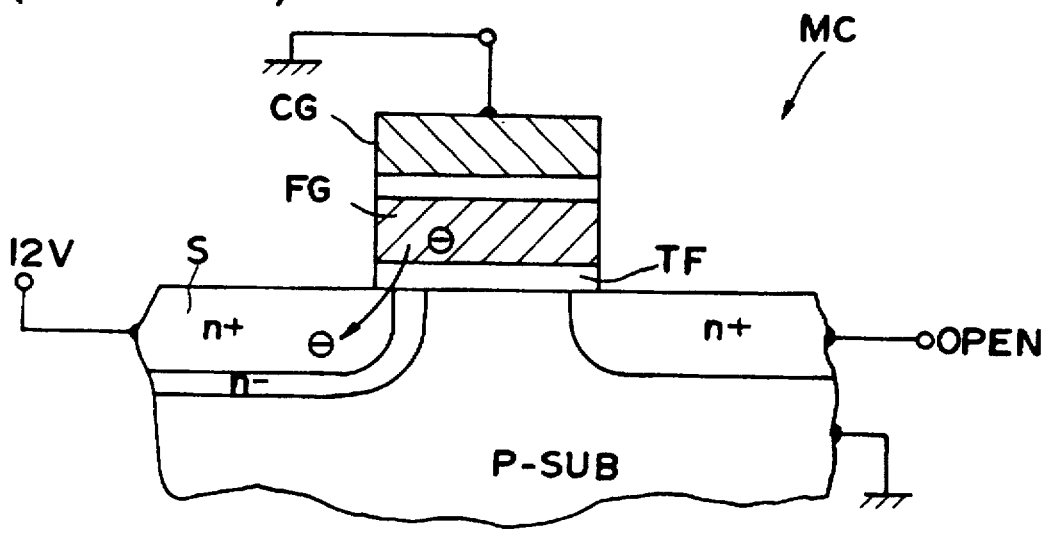
Figure 17A:
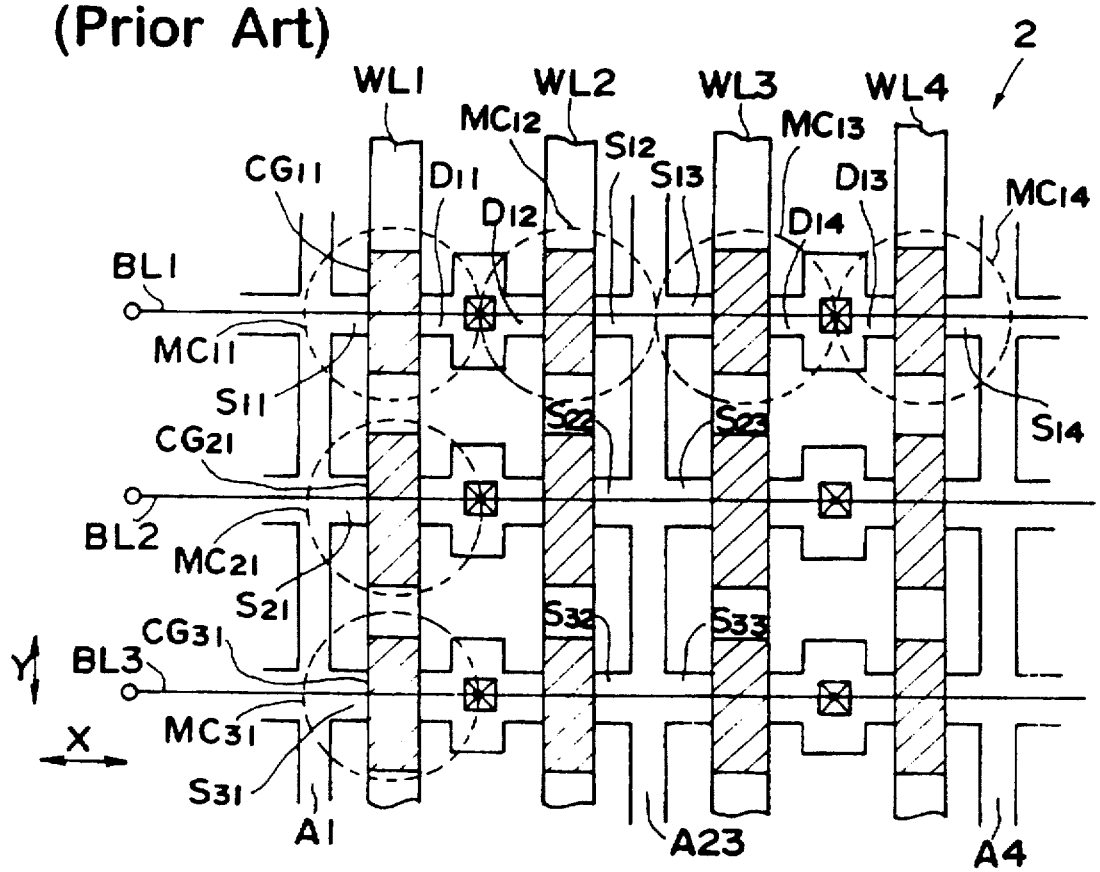
FIG. 17A is a plane view illustrating a planar structure of a conventional EEPROM.
Figure 17B:
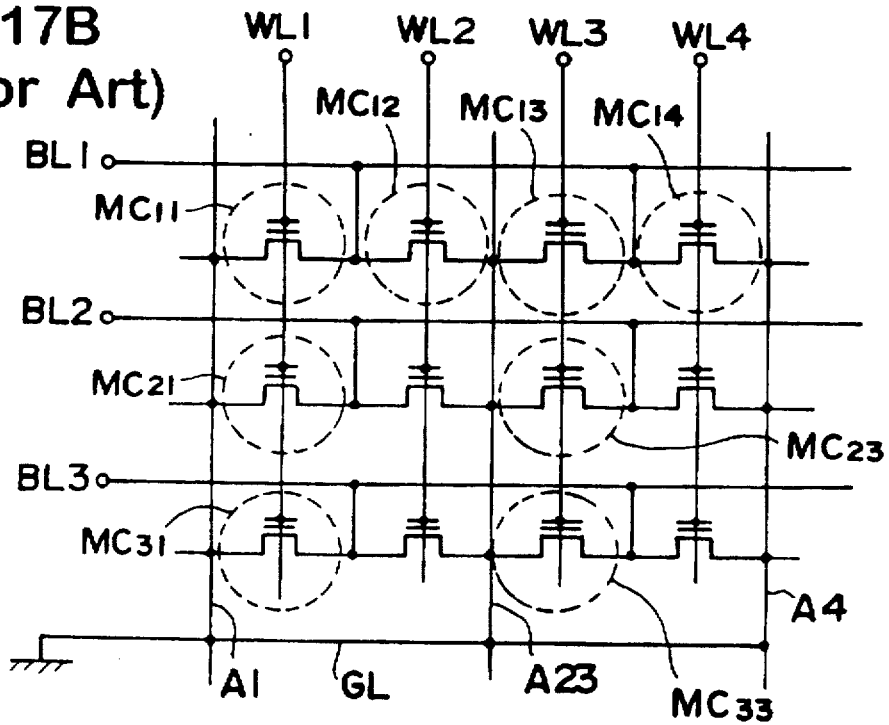
FIG. 17B is a view illustrating connections of a conventional EEPROM.
Figure 18A:
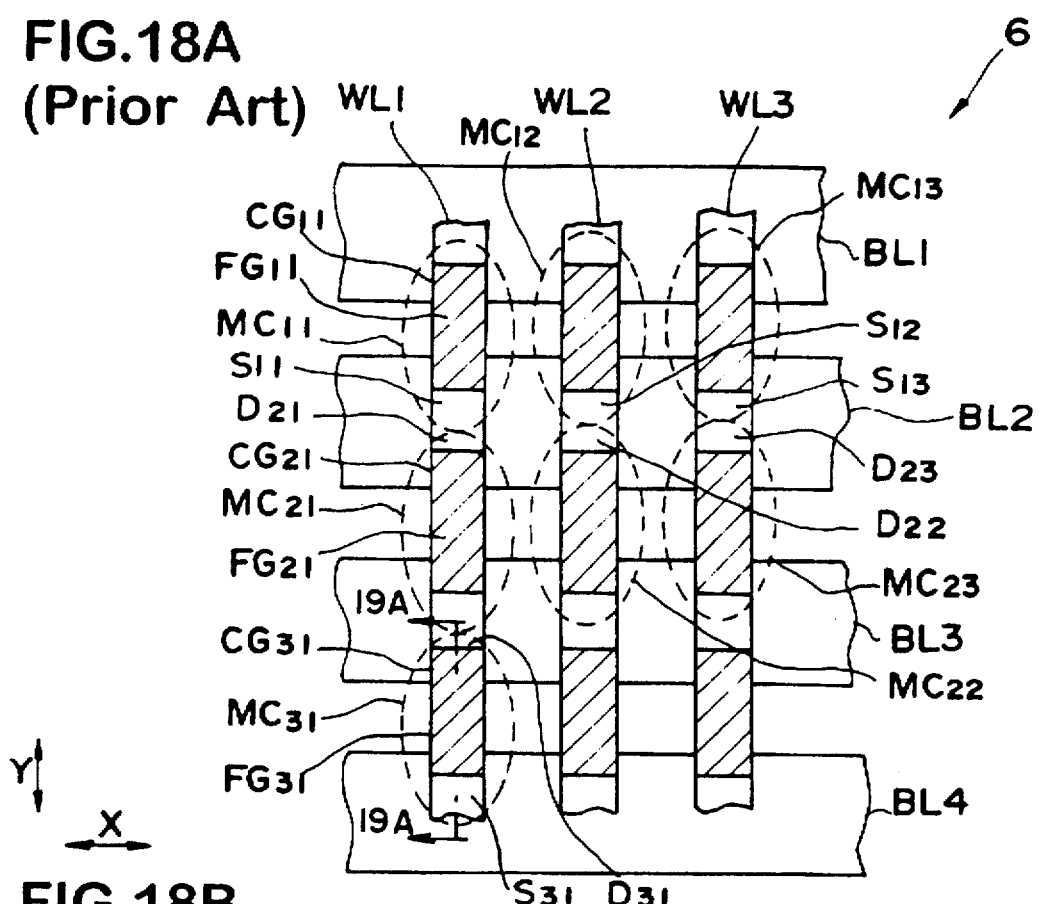
FIG. 18A is a plane view illustrating a planar structure of another conventional EEPROM.
Figure 18B:
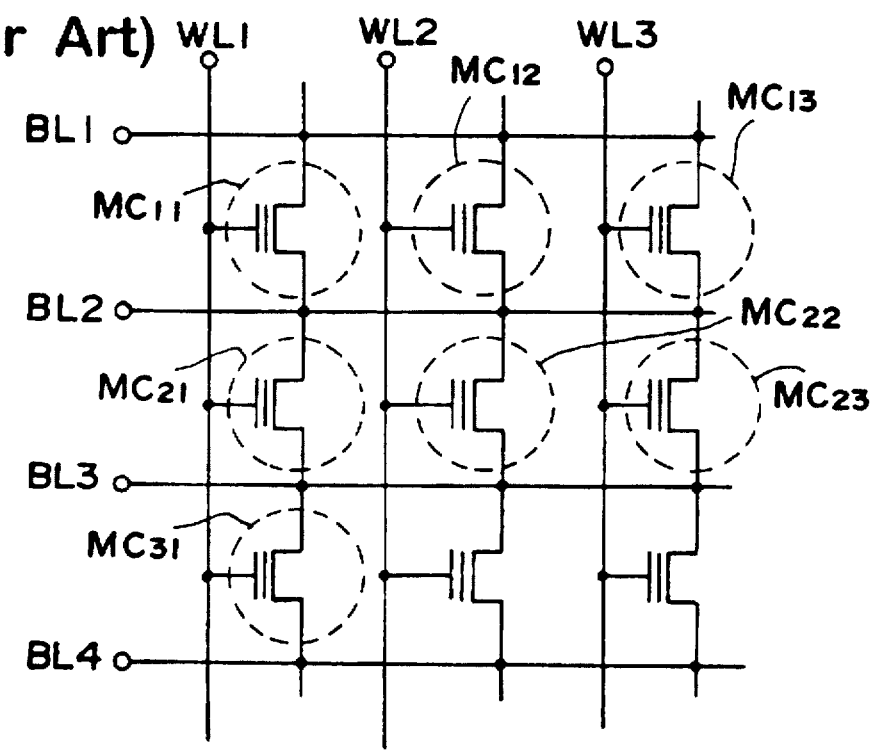
FIG. 18B is a view illustrating connections of another conventional EEPROM.
Figure 19A:
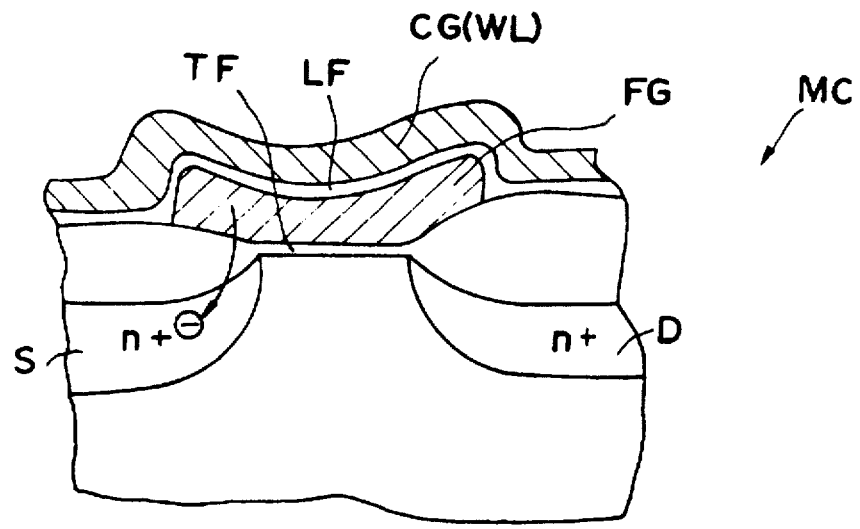
FIGS. 19A and 19B are sectional views illustrating structure of the EEPROM of another conventional EEPROM.
Figure 19B:
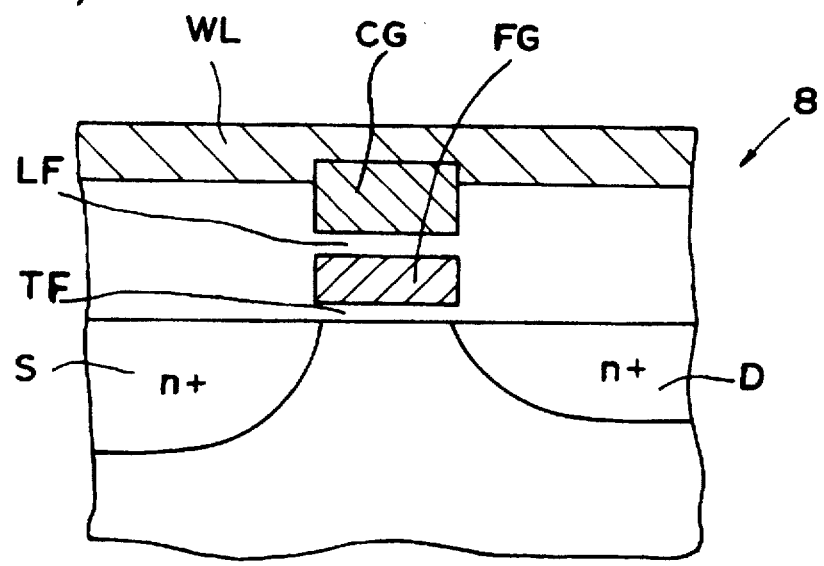

As a result of the application of these voltages described in the above, a state of the memory cell MC53 becomes the same state as the memory cell MC shown in FIG. 16B. So that, the electrons thus trapped into the floating gate FG53 of the memory cell MC53 are pulled out to the source region S53 by jumping over the tunnel oxidation layer TF53 (see FIG. 2A). Therefore, a state of the memory cell MC53 comes back to "0" state. Consequently, it is possible to erase "1" written in the memory cell MC53 selectively.

In the operation described in the above, the word lines WL1, WL2 and WL4 are opened during the erasion (illustrated in "* 1" as shown in row (b) in FIG. 5), it is possible to apply a high voltage such as 5V to these word lines. So that, application of the high voltage to the word lines will ensure the erasion of only the data in the memory cell MC53. Therefore in order to erase the data stored in the memory cell MC53 for sure, it is preferable to apply a high voltage to the word lines.

Further, the data written in the desired memory cell within the memory cells MC52, MC53 and MC54 can selectively be erased by adjusting a voltage Vw applied to the word lines WL1, WL2, WL3 and WL4 appropriately in a range of 0V≦Vw≦12V. The memory cells MC52, MC53 and MC54 composing the same row. For instance, the data stored in both the memory cells MC53 and MC54 can be erased selectively when voltages shown in row (b) of FIG. 5 are applied to the bit lines BL0 to BL7 in addition to applying a voltage of 5V to the word lines WL1 and WL2, with application a voltage of 0V to the word lines WL3 and WL4.

In the voltage shown in the row (b) of FIG. 5, a voltage of 0V (ground voltage) is applied to the word line WL3, and a high voltage of 12 V is applied to the bit line BL4. These voltages can be shifted in negative direction. For instance, it is possible to apply a negative high voltage of −10V to the word line WL3 and a voltage of 5V to the bit line BL3.

The word lines become a side of high voltage when data are erased (the side which has higher absolute voltage value than the voltage to the semiconductor substrate 22). The word lines have a structure which hard to cause a current leakage. So that, a high voltage (−10V) can be generated from the power source of 5V using a transformer. Therefore, unitization of the power source of 5V can be achieved.

As shown in row (c) of FIG. 5, a voltage of 5V is applied exclusively to the word line WL3, and the ground voltage of 0V is applied to other word lines WL1, WL2 and WL4 when the data stored in the memory cell MC53 are read out. Also, a voltage of 1V is applied to the bit line BL5, with either of application of a voltage of 1V to the bit line BL6 or open the bit line BL6. In addition to above, the ground voltage is applied to other bit lines BL0, BL1, BL2, BL3, BL4 and BL7. During application of the voltage, the ground voltage is also applied to the semiconductor substrate 22.

By applying these voltages as described in the above, a current flows between the source region S53 and the drain region D53 of the memory cell MC53, because a channel is formed in the channel region CH53 shown in FIG. 2A when the memory cell MC53 is in "0" state. In other words, the current flows between the bit line BL4 and the bit line BL5. On the other hand, the current does not flow between the source region S53 and the drain region D53 of the memory cell MC53, because a channel is not formed in the channel region CH53 when the memory cell MC53 is in "1" state. In other words, the current does not flow between the bit line BL4 and the bit line BL5. So that, the data stored in the memory cell MC53 can be read out by detecting the current flows on the bit line BL5 as a drain current.

The reason for application of a voltage of 1V to the bit line BL6, or opening the bit line BL6 in row (c) of FIG. 5 is described in below. The bit line BL6 is different from other bit lines BL0, BL1, BL2, BL3, BL4 and BL7 each of which being applied the ground voltage 0V. If the ground voltage is applied to the bit line BL6 and the memory cell MC63 is in "0" state, the memory cell MC63 is turned on by potential difference caused between the bit lines BL5 and BL6 as shown in FIG. 4. So that, a current flows between the bit line BL5 and BL6. Therefore, a decision is made that the memory cell MC53 is in "0" state by detecting the current flows on the bit line BL5 even when the memory cell MC53 is in "1" state.

Although the ground voltage of 0V is applied to other word lines WL1, WL2 and WL4 in the row (c) of FIG. 5, negative voltages such as −3V can be applied to these word lines. Thus, it is possible to eliminate influences caused by either of the memory cells MC52 or MC54 even when the data stored in other memory cells composing the same row such as the memory cell MC52 or MC54 are over-erased (that is the threshold voltage becomes less than 0V). Therefore it is preferable to apply the negative voltages to the word lines.

Consequently, write, erase and read operation to the memory cell MC53 can be carried out. Further, it is possible to carry out write, erase and read operation to all the memory cells such as the memory cells MC11 to MC74 respectively. Application of the voltages described in the above are some of examples, it is not limited to do so in the present invention.

Next, a method for manufacturing the EEPROM 20 will be described in accordance with FIGS. 6A, 6B, 6C, FIGS. 7A, 7B, 7C, FIGS. 8A, 8B, 8C, FIGS. 9A, 9B, 9C, FIG. 10, FIG. 1, FIGS. 2A and FIG. 2B. At first, a silicon oxidation layer for separating the devices formed by the method of a local oxidation of silicon (hereinafter referred to as LOCOS layer 26, described later) is formed on a device separation region 24 of the semiconductor substrate 22 made of positive type semiconductor as shown in FIGS. 6A, 6B and 6C. The LOCOS layer 26 is formed by growing a silicon oxidation layer of the device separation region 24 selectively until it reaches to a thickness of approximately 7,000 Å under a vapor atmosphere approximately at 1,000° C. FIG. 6A is a plain view of the EEPROM 20 in this process. FIGS.

6B and 6C are views illustrating plane of P—P and plane of Q—Q in FIG. 6A respectively.

Thereafter, a tunnel oxidation layer TF is formed in a thickness of approximately 100 Å on the device formation regions 28 located between the device separation regions 24 as shown in FIGS. 7A, 7B and 7C. Then a floating gate FG made of polysilicon is formed on upper portion of the tunnel oxidation layer TF. The floating gate FG is formed by carrying out doping of phosphor by diffusion to the polysilicon layer which is formed with a CVD method so as to cover the upper surface of the semiconductor substrate 22 completely, then the polysilicon layer thus doped is patterned by a photolithography method.

Figure 8A:
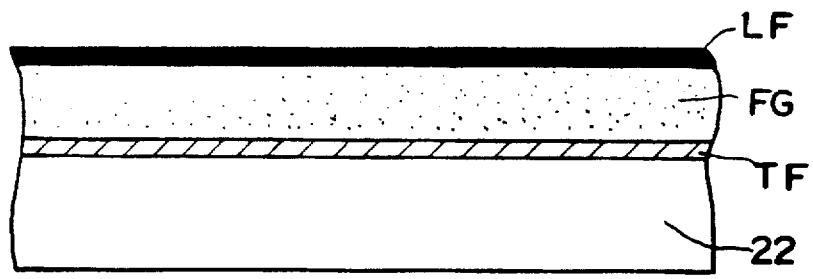
FIGS. 8A and 8B are views illustrating a part of the manufacturing processes of the EEPROM in an embodiment of the present invention.
Figure 8B:
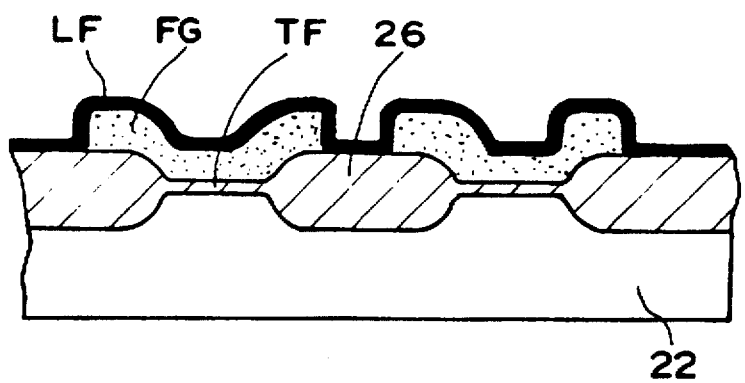

Further to that, an inter layer LF is formed so as to cover the upper surface of the semiconductor substrate 22 completely as shown in FIGS. 8A and 8B. In this embodiment, an ONO (a layer composed of three-ply structure such as to accumulate an oxide layer, nitride layer and an oxide layer) layer formed by a thermal oxidation method or a CVD method is used as the inter layer.

Next, the control gate, that is the word lines WL are formed as shown in FIGS. 9A, 9B and 9C. At first, a polysilicon layer which becomes the word line WL is formed by a CVD method so as to cover the upper surface of the semiconductor substrate 22 completely. The thickness of the polysilicon layer is adjusted to be a thickness of approximately 4,000 Å. In this embodiment, a poly-cide layer (a layer composed of two-ply structure such as to accumulate a polysilicon layer and silicide layer) can be used instead of the polysilicon layer. Then, phosphor is doped by carrying out diffusion to the polysilicon layer thus formed to secure conductivity.

Further, an insulation layer 30 made of a silicon oxidation layer or the like is formed so as to cover the upper surface of the polysilicon layer thus formed. The insulation layer is a layer to secure electric insulation between the word lines WL and polysilicons 34 for contacts described later.

Thereafter, the word lines WL are formed by carrying out patterning of the polysilicon layer etc. using the photolithography method. During the process, both the inter layer LF and the floating gate FG are also patterned.

Figure 10:
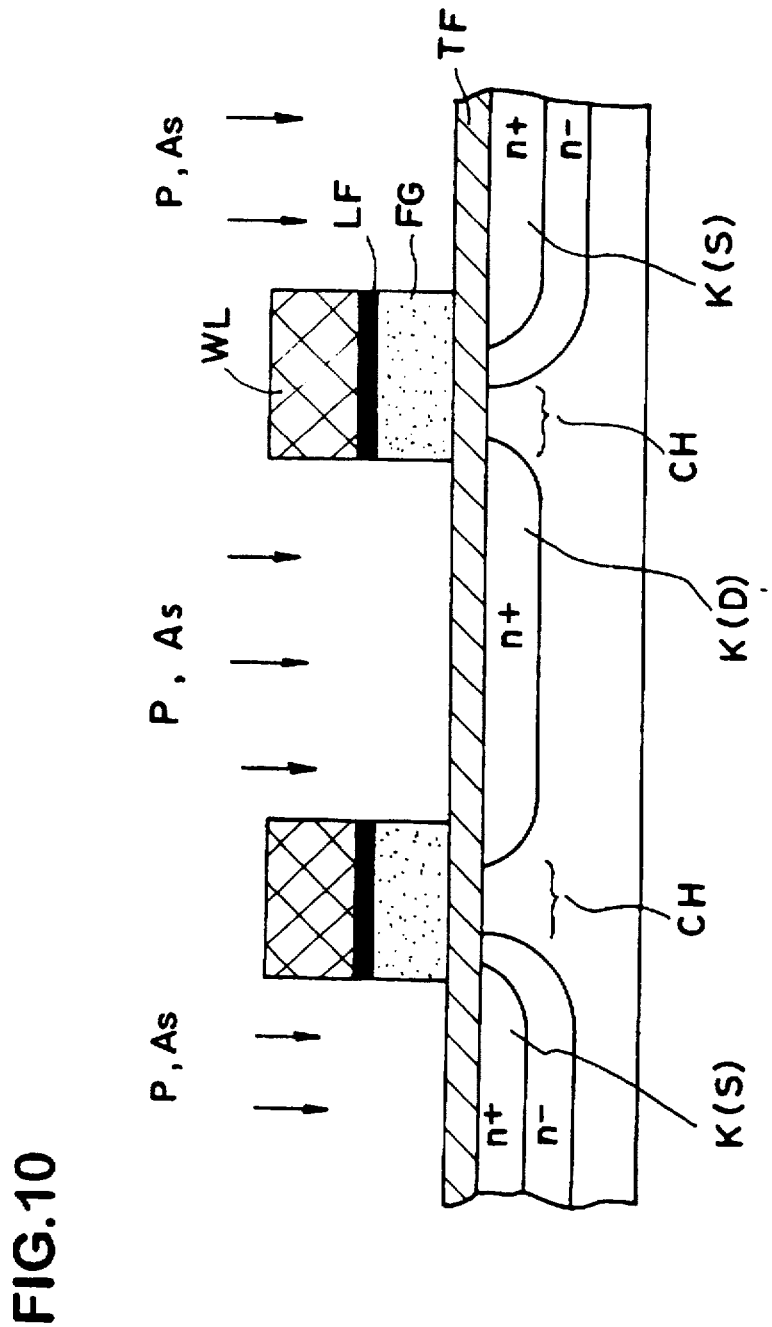
FIG. 10 is a view illustrating a part of the manufacturing processes of the EEPROM in an embodiment of the present invention.

Next, in order to form a plurality of independent active region K such as source regions S, drain regions D or the like shown in FIG. 10, phosphor and arsenic as negative impurities are implanted ionically beyond the tunnel oxidation layer TF. In this embodiment, phosphor in a range of $1 \times 10^{14}$ /cm$^2$ is implanted exclusively to the source regions S to form an n part, and arsenic in a range of $5 \times 10^{15}$ /cm$^2$ is implanted to both the source regions S and the drain regions D to form an n part.

During the implantation of the impurities, the impurities reach to only the part where to be the independent active regions K00 to K74 shown in FIG. 1, because both the word line WL and the LOCOS layers 26 as a mask as shown in FIG. 9A. So that, the independent active regions such as the source regions S and the drain regions D are formed by means of self-alignment against the channel region CH as shown in FIG. 10.

Further, as shown in FIG. 1, the bit line BL3 and the bit line BL4 are formed as described below. The bit line BL3 is formed so as to connect the independent active regions K30, K31, K32 and K33 of the memory cells MC41, MC42, MC43 and MC44 with one another, and the bit line BL4 is formed so as to connect the independent active regions K41, K42, K43 and K44 of the memory cells MC41, MC42, MC43 and MC44 with one another. The memory cells MC41, MC42 and MC43 compose the fourth row. Other bit lines such as bit lines BL0, BL1, BL2, BL5, BL6 and BL7 are composed in the same way. The process for composing these bit lines is described in detail as below.

As shown in FIG. 2A, side walls 32 are formed by a silicon oxidation compound having insulation, and the polysilicons 34 for the contacts are formed so as to contact with each of the independent active regions K00 to K74.

Next, an inter insulation layer 36 made of a boro-phospho-silicate glass (BPSG) by a chemical vapor deposition (CVD) method is formed so as to cover the upper surface of the semiconductor substrate 22 completely, and a reflow process is carried out to the inter insulation layer 36 for smoothness of the surface. The independent actives region such as the source regions S and the drain regions D shown in FIG. 10 are formed by carrying out the thermal diffusion of phosphor and arsenic as the negative type impurities implanted tonically in the previous process. The thermal diffusion is caused by the heat added in the reflow process.

In addition, contact holes 38 reach to the polysilicons 34 are formed in the inter insulation layer 36. The contact holes 38 are formed by patterning the inter insulation layer 36 using the photolithography method, and then the inter insulation layer 36 is etched by reactive ion etching (RIE) method.

Thereafter, the bit lines BL0 to BL7 made of polysilicon are formed so as to contact with the polysilicons 34 through the contact holes 38. Thus, each of the independent active regions K00 to K74 are connected to the bit lines BL0 to BL7.

Although each of the independent active regions K00 to K74 are connected to the bit lines BL0 to BL7 through the polysilicons 34 for the contacts in this embodiment as shown in FIG. 2A and FIG. 2B, the independent active regions K00 to K74 can be connected directly to the bit lines BL0 to BL7 without providing the polysilicons 34 for the contacts when the distance between the independent active regions K00 to K74 and the bit lines BL0 to BL7 is short.

To complete the manufacturing process of the EEPROM 20, a passivation layer (not shown) made of silicon nitride layer is formed so as to cover surface of the semiconductor substrate 22 completely by a plasma chemical vapor deposition (CVD) method. Thus, the manufacturing process of the EEPROM 20 is completed.

Figure 11A:
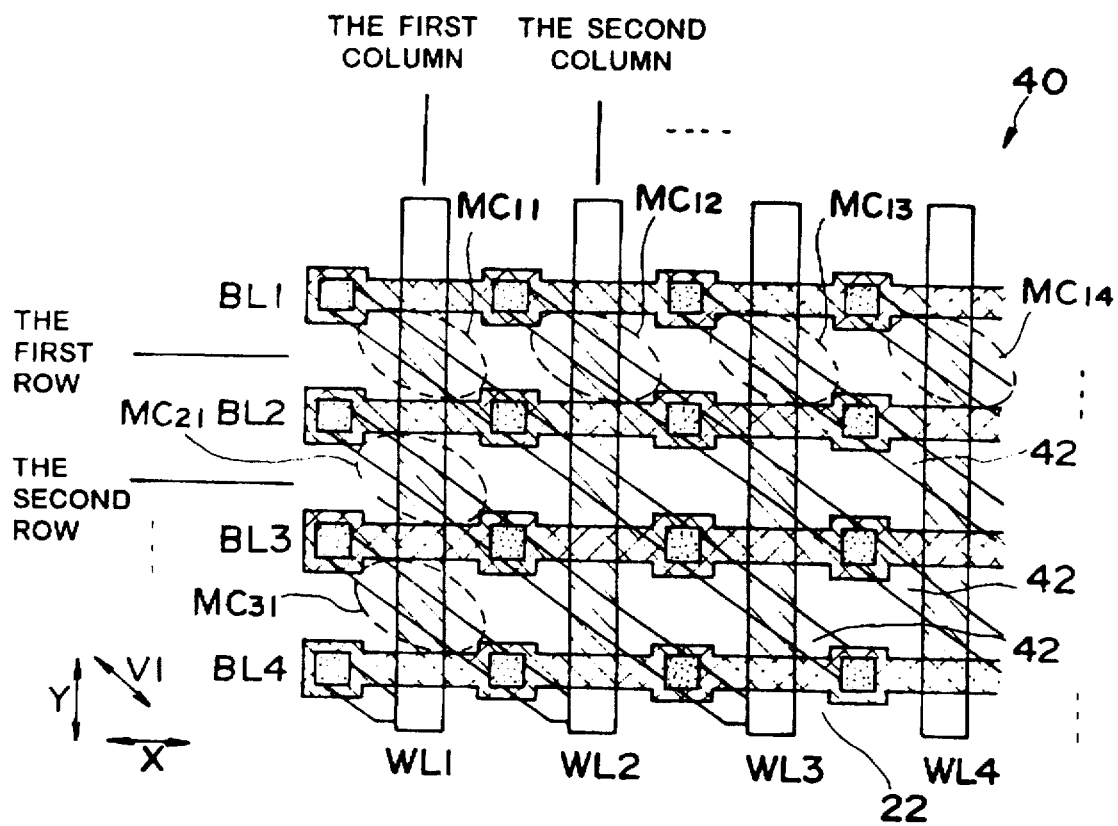
FIG. 11A is a plane view illustrating a planar structure of the EEPROM in another embodiment of the present invention.
Figure 11B:
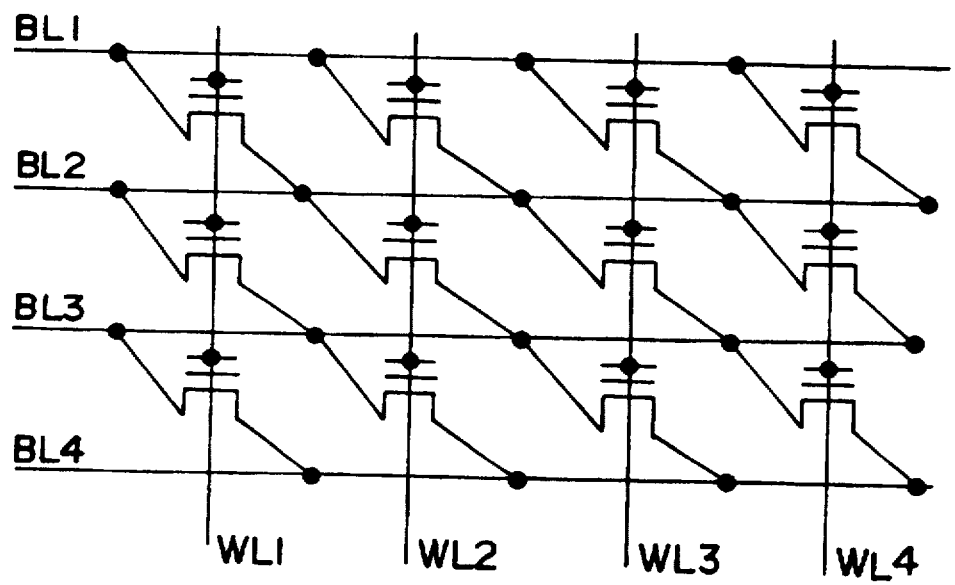
FIG. 11B is a view illustrating connections of the EEPROM in another embodiment of the present invention.

Next, FIG. 11A is a plane view illustrating a planar structure of an EEPROM 40 in another embodiment of the present invention. FIG. 11B is a view of connection for the EEPROM 40. The EEPROM 40 has common characteristics with the EEPROM 20 shown in FIG. 1 in view of followings. The EEPROM 40 is composed by arranging a plurality of memory cell having a sectional structure shown in FIG. 2A formed on the semiconductor substrate 22 in matrix configuration. The elements composing the columns in the matrix are arranged toward the direction of "Y", and the memory cells composing one row are formed across the different device formation regions 42 respectively.

However, the EEPROM 40 has different characteristics with the EEPROM 20 in view of followings. Although, the elements composing the rows in the matrix are arranged toward the direction of "X", as well as the device formation regions 42 are formed linearly to have a longitude toward a direction of "V1" in the EEPROM 40, in the EEPROM 20 the elements composing the rows in the matrix are arranged toward the direction of "U", and all of the device formation regions 28 are formed linearly to have a longitude toward a direction of "X" (see FIG. 1).

Thus, the bit lines BL1, BL2, BL3 and BL4 can be designed to have a longitude toward the direction of "X" by arranging the elements composing the rows in the matrix toward the direction of "X". So that, it is possible to design the EEPROM 40 to intersect the bit lines BL1, BL2, BL3 and BL4 with the word lines WL1, WL2, WL3 and WL4 at a right angle. Therefore, arrangement of peripherals such as decoders (not shown) can be done easily.

Figure 12A:
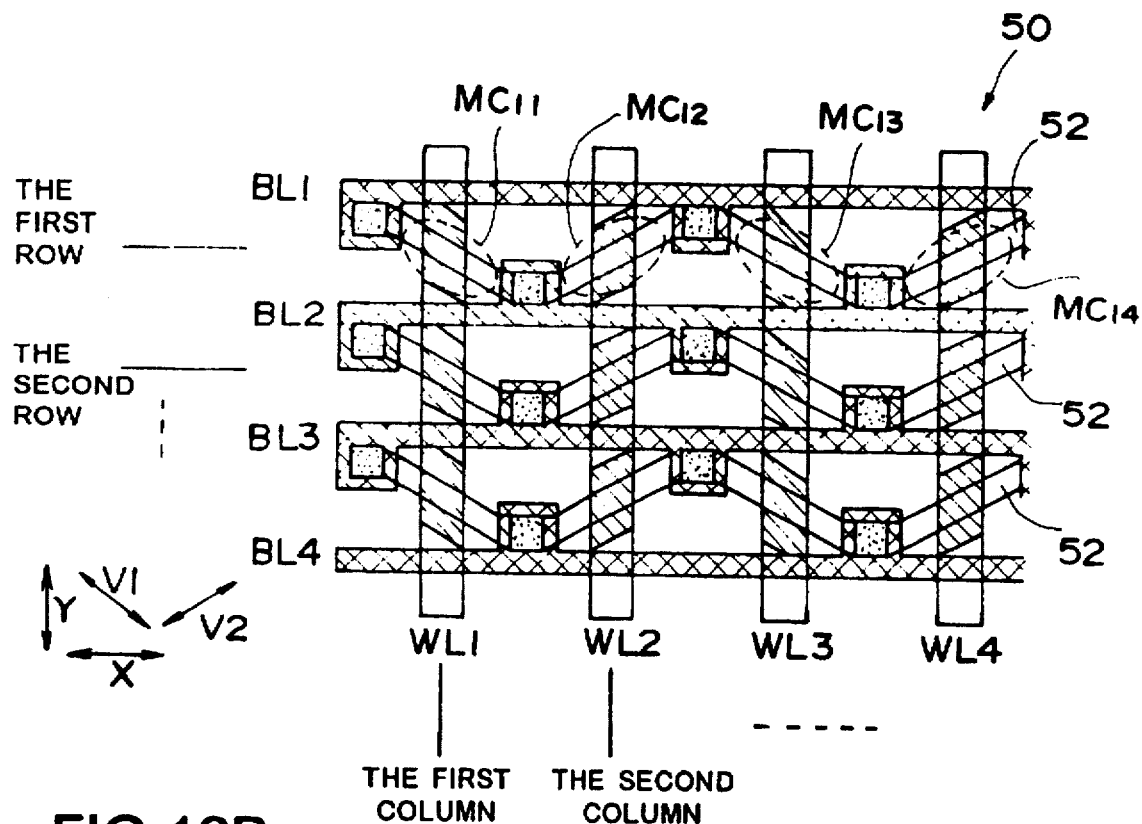
FIG. 12A is a plane view illustrating a planar structure of the EEPROM in far another embodiment of the present invention.
Figure 12B:
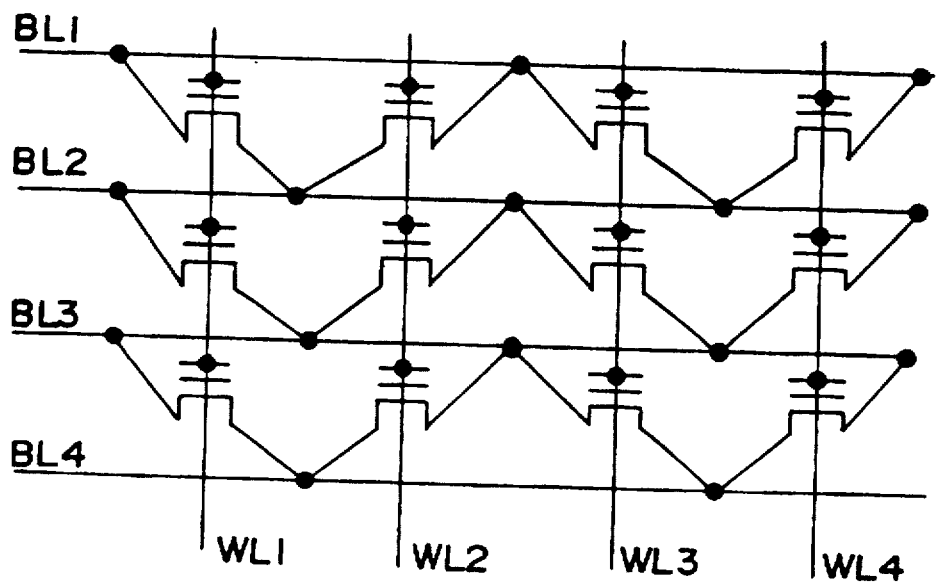
FIG. 12B is a view illustrating connections of the EEPROM in far another embodiment of the present invention.

FIG. 12A is a plane view illustrating a planar structure of the EEPROM 50 in far another embodiment of the present invention. FIG. 12B is a view of connection for the EEPROM 50. The EEPROM 50 has common characteristics with the EEPROM 40 shown in FIGS. 11A, 11B in view of intersecting the bit lines BL1, BL2, BL3 and BL4 with the word lines WL1, WL2, WL3 and WL4 at a right angle by arranging the elements composing the rows in the matrix toward a direction of "X".

However, the EEPROM 50 has different characteristics with the EEPROM 40 in view of followings. Although the memory cells composing the same row are formed within the same device formation region 52 in the EEPROM 50, in the EEPROM 40 the memory cells composing the same row are formed in the different device formation regions 42 respectively (see FIGS. 11A and 11B).

Figure 13A:
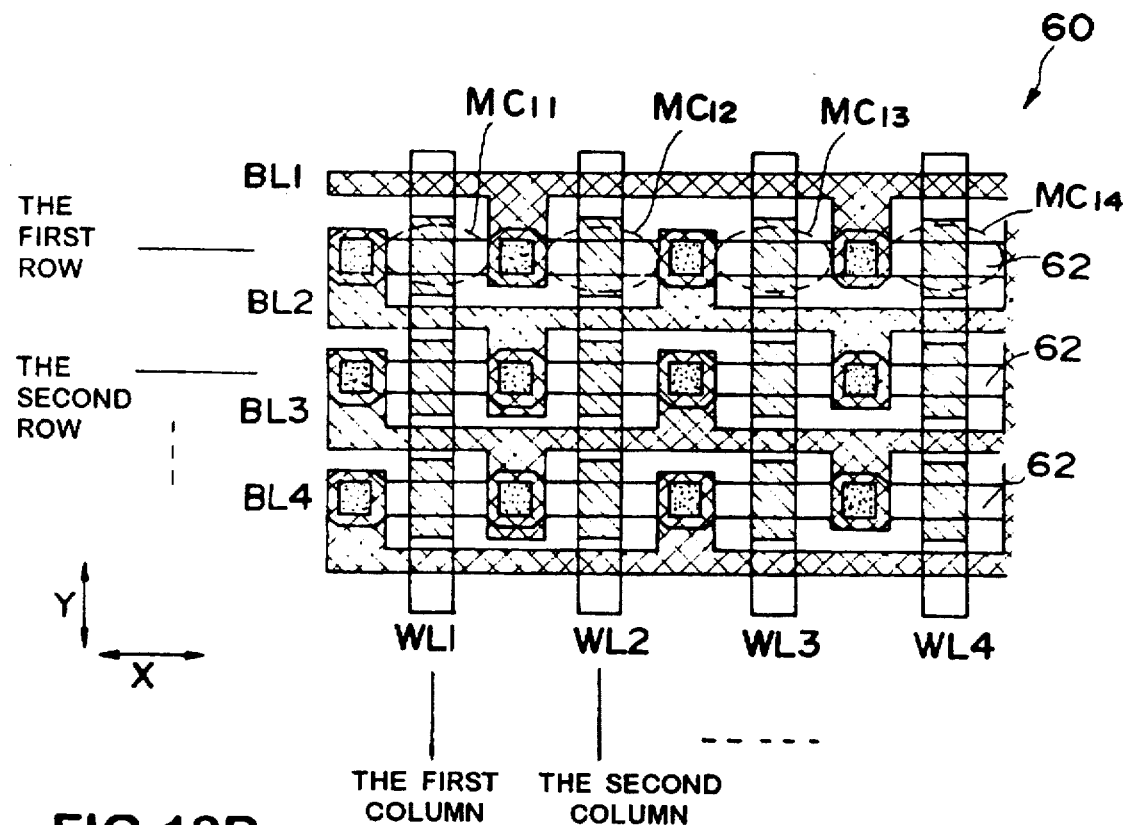
FIG. 13A is a plane view illustrating a planar structure of the EEPROM in still another embodiment of the present invention.
Figure 13B:
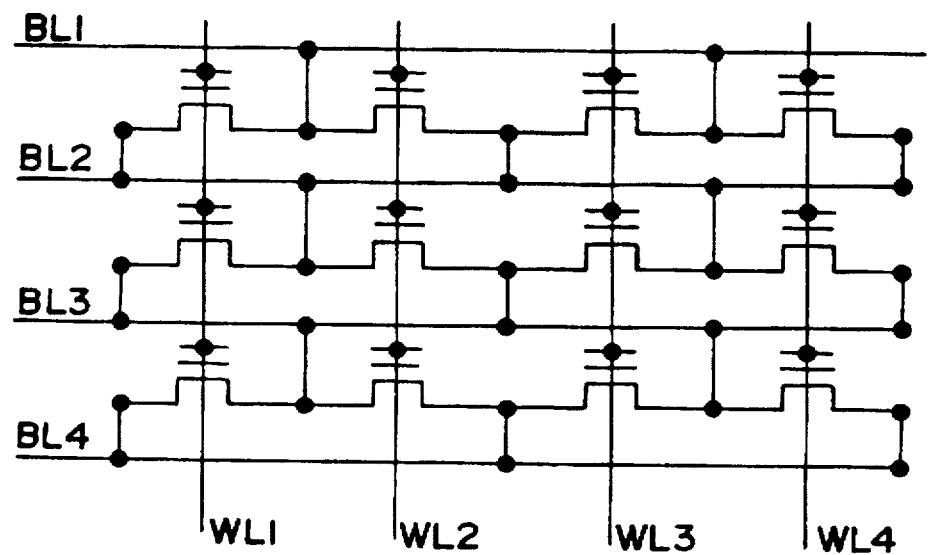
FIG. 13B is a view illustrating connections of the EEPROM in still another embodiment of the present invention.

FIG. 13A is a plane view illustrating a planar structure of the EEPROM 60 in still another embodiment of the present invention. FIG. 13B is a view of connection for the EEPROM 60. The EEPROM 60 has common characteristics with the EEPROM 50 shown in FIGS. 12A, 12B in view of the memory cells composing the same row are formed within the same device formation regions 62.

However, the EEPROM 60 has different characteristics with the EEPROM 50 in view of followings. Although, the device formation regions 62 are formed linearly to have a longitude toward the direction of "X" in the EEPROM 60, in the EEPROM 50 the device formation regions 52 are formed in a wave form by connecting a line shaped regions with each other each of which have a longitude toward directions of "V1" and "V2" (see FIGS. 12A and 12B).

Figures 14A, 14B:
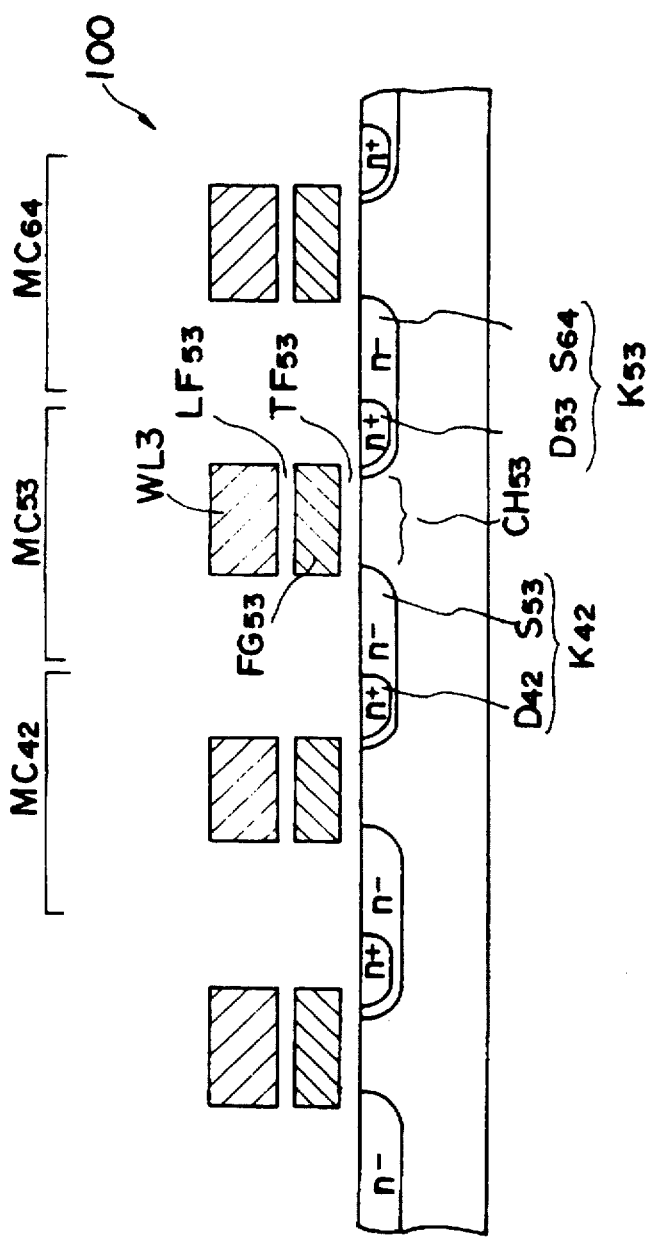
FIG. 14A is a sectional view, taken along the plane of line P—P of the EEPROM in far still another embodiment of the present invention.
FIG. 14B is a sectional view, taken along the plane of line Q—Q of the EEPROM in far still another embodiment of the present invention.

FIGS. 14A and 14B are the sectional view of the EEPROM 100 in still another embodiment of the present invention. The planar structure of the EEPROM 100 is identical with that of the EEPROM 20 shown in FIG. 1. Also, the connection of the EEPROM 100 is the same as that of the EEPROM 20 shown in FIG. 4. Further, the EEPROM 100 comprises a total of 20 of the independent active regions K00 to K74 located between the word line WL1 to WL4, which also being comprised by the EEPROM 20.

However, the EEPROM 100 has different characteristics with the EEPROM 20 in view of followings. Although, two different kind of regions of two adjacent memory cells are provided continuously so as to form one independent active region in the EEPROM 100, in the EEPROM 20 one independent active region is formed by continuously providing two of the same kind of regions of two adjacent memory cells. Such as the independent active region K42 is formed by providing the drain region D42 and the source region S53 of the memory cell MC42 and MC53 in the EEPROM 100. On the other hand, the independent active region K42 is formed by providing both the source regions S42 and S53 of the memory cells MC42 and MC53 located adjacently, as well as forming the independent active region K53 by providing both the drain regions D53 and D64 of the memory cells MC53 and MC64 located adjacently in the EEPROM 20 (see FIG. 2A).

The structure which forms one independent active region by providing the drain region and the source region of two adjacent memory cells can be applied to the EEPROM 20 shown in FIG. 1, as well as to the EEPROM 40 shown in FIGS. 11A and 11B.

Also, the EEPROM 100 has different characteristics with the EEPROM 20 in view of following. Although in the EEPROM 100, the electrons are trapped into each of the floating gates FG11 to FG74 previously, each of the floating gates FG11 to FG74 does not trap any electrons previously in the EEPROM 20.

As a result, the EEPROM 100 has different characteristics with the EEPROM 20 in view of followings. Although, "0" state is the state when the electrons are trapped into each of the floating gates FG11 to FG74 and the "1" state is the state when the electrons have been pulled out from the floating gates FG11 to FG74 in the EEPROM 100, in the EEPROM 20, the "0" state is the state when the electrons are not trapped in the floating gates FG11 to FG74 and the "1" state is the state when the electrons are trapped into each of the floating gates FG11 to FG74.

So that, voltage conditions to perform write, erase and read operation to the EEPROM 100 are different from that of the EEPROM 20 (see FIG. 5). For instance, FIG. 15 shows the voltages for performing write, erase and read operation to the memory cell MC53 of the EEPROM 100.

In order to write "1" to the memory cell MC53, the voltages shown in row (d) in FIG. 15 are applied to each of the word lines WL1, WL2, WL3 and WL4 as well as each of the bit lines BL0 to BL7. So that, the electrons trapped into the floating gate FG53 of the memory cell MC53 shown in FIG. 14A are pulled out to the drain region D53 by jumping over the tunnel oxidation layer TF53. Hence, "1" is written in the memory cell MC53.

To erase "1" written in the memory cell MC53, the voltages shown in row (e) in FIG. 15 are applied to each of the word lines WL1, WL2, WL3 and WL4 as well as to each of the bit lines BL0 to BL7. Thus, the electrons are trapped into the floating gate FG53 from the channel region CH53 of the memory cell MC53 by jumping over the tunnel oxidation layer TF53. Therefore, a state of the memory cell MC53 comes back to "0" state.

The voltages shown in row (f) in FIG. 15 are applied to each of the word lines WL1, WL2, WL3 and WL4 as well as to each of the bit lines BL0 to BL7 when the data written in the memory cell MC53 are read out. By applying the voltages as described in the above, a current does not flow between the source region S53 and the drain region D53 of the memory cell MC53, because a channel is not formed in the channel region CH53 shown in FIG. 14A when the memory cell MC53 is in "0" state. In other words, the current does not flow between the bit line BL4 and the bit line BL5. On the other hand, the current flows between the source region S53 and the drain region D53 of the memory cell MC53, because a channel is formed in the channel region CH53 when the memory cell MC53 is in "1" state. In other words, the current flows between the bit line BL4 and the bit line BL5. This relationship show in above is opposite to a relationship of the EEPROM 20 shown in FIG. 1.

Consequently, write, erase and read operation to the memory cell MC53 can be carried out. Further, it is possible to carry out write, erase and read operation in the same way to all the memory cells such as the memory cells MC11 to MC74 respectively.

Although, the control gates can also be used as the word lines in the embodiments described in the above, the present invention can also be applied to a semiconductor memory device which provides the control gates under different process of providing the word lines. However, it is preferable to use the control gates as the word lines in consideration of the manufacturing cost.

Although, the bit lines are made of polysilicon in the embodiments described in the above, another materials having lower electric resistance than the burried layer such as aluminum, alloy of aluminum-silicon, alloy of aluminum-silicon-copper or the like can be used for the bit lines.

The present invention is applied to the EEPROMs each of which has a plurality of floating gate type memory cell in the embodiments described in the above. Application of the present invention is not limited to the EEPROM having the floating gate type memory cells. The present invention can also be applied to an nonvolatile memory comprising metal nitride oxide semiconductor (MNOS) type memory cells which store the data into a trap layer having electric insulation by trapping the electrons into the trap layer (see Japanese laid open publication number Hei 5-326893) or other nonvolatile memory device. Further, the present invention can be applied to all the semiconductor memory devices including a volatile memory.

The present invention is characterized in that, one bit line is formed by connecting the source regions of the memory cells composing the same row, and wherein other one bit line is formed by connecting the drain regions of the memory cells composing the same row, and wherein the bit lines located adjacently of adjacent rows are used in common to one another. In other words, one of the characteristics of the present invention is to employ virtual ground array structure.

So that, no active regions for connecting the source regions are required between the word lines. Further, it is not necessary to provide ground lines for grounding the active regions between the bit lines. Therefore, the higher integration of the memory cells can be realized.

Also, the present invention is characterized in that, the independent active regions are provided between the word line located adjacently. So that, the word lines and the independent active regions (in other words both the source regions and the drain regions) are not overlapped one another. Therefore, both the source regions and the drain regions can be formed after making up the word lines.

As a result of that, the higher integration of the memory cells can be realized without concerning another thermal diffusion of the source regions and the drain regions caused by heat-treatment carried out later on. Further, the much higher integration of the memory cells can be realized as a result of capability of carrying out precise alignment among the channel regions, source regions and the drain regions. This is because of the source regions and the drain regions can be formed by means of self-alignment using the word lines as a mask.

Further, the present invention is characterized in that, the control gates can be used in common to the word lines. So that, the manufacturing cost can be reduced, because the process of forming the control gates and that of forming the word lines can be carried out in one step.

Still further, the present invention is characterized in that, a plurality of independent active region are provided, and each of the independent active regions are only used in common to two memory cells, and wherein bit lines are formed by connecting the independent active regions with conductive substance.

So that, a high-speed data reading can be realized due to lower electric resistance of the bit lines in comparison with the case of using active layers as the bit lines. The active layers are provided to use in common among a plurality of the memory cell.

In other words, it is possible to provide a semiconductor memory device, a method for manufacturing thereof and a connecting method of virtual ground array of the semiconductor device realizing a high-integration, a high-speed data reading with lower manufacturing cost.

The present invention is characterized in that, the memory cells are arranged toward a direction so as a direction of arranging the memory cells composing the same column and a direction of arranging the memory cells composing the same row to intersect substantially at a right-angle, and wherein so that the word lines and the bit lines intersect with one another substantially at a right-angle.

So that, arrangement of the peripherals such as decoders or the like connected to each of the bit lines and the word lines can be done easily. In other words, a semiconductor memory device having the much higher integration can be provided.

While the invention has been described in its preferred embodiments, it is to be understood that the words which have been used are words of description rather than limitation and that changes within the purview of the appended claims may be made without departing from the true scope and spirit of the invention in its broader aspects. Therefore, it is possible to realize a semiconductor device which prevent damages caused by the anisotropic etching with saving manufacturing cost.

What is claimed is:

1. A semiconductor memory device comprising a plurality of memory cells in a matrix configuration on a semiconductor substrate, each of the memory cells including a source region, a drain region and a channel region formed between the source region and the drain region having a control gate located at a right angle spacing from the channel region, said memory device including a word line formed by connecting control gates of the memory cells composing a same column, said memory device also including independent active regions formed between each pair of adjacent said word lines, each of the independent active regions being composed of one of a pair of the source regions of two different memory cells, a pair of the drain regions of two different memory cells, and a pair of the source region and the drain region of two different memory cells, wherein the two different memory cells are connected to the adjacent said word lines, said memory device further including one bit line formed by connecting the independent active regions with a conductive substance so that the source regions of the memory cells compose a same connected row, said memory device still further including another bit line formed by connecting the independent active regions with a conductive substance so that the drain regions of the memory cells compose the same connected row.

2. A semiconductor memory device in accordance with claim 1, wherein the memory cells are arranged in a first direction to compose the same column and in a second direction to compose the same row, said columns and rows intersecting at substantially right-angles, and wherein the word lines and the bit lines intersect with one another substantially at right-angles.

3. A semiconductor memory device in accordance with claim 2, wherein the memory cells composing the same row are formed on a same device formation region.

4. A semiconductor memory device in accordance with claim 3, wherein the same device formation region is substantially formed as a straight line.

5. A semiconductor memory device in accordance with claim 3, wherein the same device formation region is substantially formed in a wave shape having a regular pattern.

6. A semiconductor memory device in accordance with claim 2, wherein the memory cells composing the same row are formed on different device formation regions respectively.

7. A semiconductor memory device in accordance with claim 1, wherein the memory cells are arranged in a first direction to compose the same column and in a second direction to compose the same row, said columns and rows not intersecting at right-angles, and wherein the word lines and the bit lines also do not intersect with one another at right-angles.

8. A semiconductor memory device in accordance with claim 7, wherein the memory cells composing the same row are formed on different device formation regions respectively.

9. A semiconductor memory device in accordance with claim 1, wherein the bit lines are made of polysilicon.

10. A semiconductor memory device in accordance with claim 1, wherein the bit lines are made of aluminum.

11. A semiconductor memory device in accordance with claim 1, wherein the bit lines are made of an alloy of aluminum and silicon.

12. A semiconductor memory device in accordance with claim 1, wherein the semiconductor memory device comprises a plurality of nonvolatile memory cell.

13. A semiconductor memory device in accordance with claim 12, wherein the nonvolatile memory cells are formed as floating gate type memory cells comprising the source region and the drain region formed on the semiconductor substrate, the channel region formed between the source region and the drain region, and a tunnel oxidation layer, a floating gate, an inter layer and the control gate accumulated one after another in that order on the channel region.

14. A semiconductor memory device in accordance with claim 12, wherein the nonvolatile memory cells are formed as metal nitride oxide semiconductor (MNOS) type memory cells comprising the source region and the drain region formed on the semiconductor substrate, the channel region formed between the source region and the drain region, a tunnel oxidation layer, a trap layer and the control gate accumulated one after another in that order on the channel region.

15. A semiconductor memory device in accordance with claim 1, wherein adjacent bit lines formed to connect rows of source regions or rows of drain regions are formed and used in common with one another.

* * * * *

UNITED STATES PATENT AND TRADEMARK OFFICE
CERTIFICATE OF CORRECTION

PATENT NO.    : 5,760,437
DATED         : June 2, 1998
INVENTOR(S)   : Shimoji

It is certified that error appears in the above-identified patent and that said Letters Patent is hereby corrected as shown below:

<u>Title page,</u>
Item [54], Title, delete entire title and replace with -- SEMICONDUCTOR MEMORY DEVICE AND A CONNECTION OF VIRTUAL GROUND ARRAY OF A SEMICONDUCTOR MEMORY --

<u>Title page,</u>
Item [30], Foreign Application Priority Data, "7-232471" should read -- HE17-232471 (P) --
Item [57], ABSTRACT,
Lines 3 and 8, "region" should read -- regions --
Lines 4, 5 and 8, "cell" should read -- cells --
Lines 4, 6 and 9, "line" should read -- lines --

<u>Column 1,</u>
Line 28, "plane" should read -- plan --
Line 34, "And word lines W1," should read -- Word lines --
Line 36, "cell" should read -- cells --
Line 38, "And the bit lines" should read -- Bit lines --
Line 41, insert -- the -- after the word "instance,"
Line 44, "with" should read -- while --
Line 44, "exclusive" should read --exclusively --
Line 47, "a part of electrons accelerated are trapped into" should read -- some of the electrons trapped in --
Lines 48-49, "by jumping" should read -- are accelerated to jump --
Lines 53-54, delete "as long as not performing erasing or writing" after the word "semi-permanently"
Lines 55-56, insert -- as long as erasing or writing is not performed -- after the word "power"
Lines 58-59, "with grounding" should read -- which grounds --
Lines 62-63, "are pulling out to" should read -- leave --
Line 64, "So that, a" should read -- Thus, the --
Line 65, "comes" should read -- goes --
Line 66, delete "of" after the word "either"

UNITED STATES PATENT AND TRADEMARK OFFICE
CERTIFICATE OF CORRECTION

PATENT NO.    : 5,760,437
DATED         : June 2, 1998
INVENTOR(S)   : Shimoji

It is certified that error appears in the above-identified patent and that said Letters Patent is hereby corrected as shown below:

Column 2,
Line 1, insert -- the -- after the word "has"
Line 2, delete "need" after the word "problems"
Line 3, "for the" should read -- for a --
Line 4, "a" should read -- in the --
Line 4, "need" should read -- needs --
Line 6, "region" should read -- regions --
Line 11, "of a" should read -- in the --
Line 14, "line" should read -- lines --
Line 14, "bit" should read -- bits --
Line 17, delete "in the" after the word "described"
Lines 25 and 31, "cell" should read -- cells --
Lines 38 and 43, "shorten" should read -- shortened --
Line 44, "So that," should read -- Thus, --
Line 51, delete "of" after the word "both"
Line 59, insert -- the -- after the words "formation of"
Line 61, "once" should read -- were earlier --
Line 65, "taken" should read -- made --
Line 65, insert -- otherwise -- after the word "it"

Column 3,
Line 1, insert -- the -- after the word "Also,"
Line 4, "become" should read -- becomes --
Line 6, "So that," should read -- As a result, --
Lines 6-7, "can not be pulled out" should read -- do not move --
Line 8, insert -- an -- before the word "erase"
Line 9, delete "in the" after the word "stated"
Line 13, "Such as the" should read -- The --
Line 24, delete "in" after the word "described"
Line 27, "become" should read -- becomes --
Lines 27-28, "So that, the" should read -- The --
Line 34, "line" should read -- lines --
Line 34, "burried" should read -- buried --
Line 49, "cell" should read -- cells --

Column 4,
Lines 12 and 21, "region" should read -- regions --
Line 32, "objections" should read -- objects --
Line 36, "plane" should read -- plan --
Line 50, "operation" should read -- operations --

UNITED STATES PATENT AND TRADEMARK OFFICE
CERTIFICATE OF CORRECTION

PATENT NO. : 5,760,437
DATED : June 2, 1998
INVENTOR(S) : Shimoji

It is certified that error appears in the above-identified patent and that said Letters Patent is hereby corrected as shown below:

Column 5,
Lines 1, 6, 12, 31, 35 and 46, "plane" should read -- plan --
Line 7, "far another" should read -- a third --
Line 9, "far another" should read -- the third --
Lines 13, and 16, "still another" should read -- a fourth --
Line 19, "far still another" should read -- a fifth --
Line 22, "far still another" should read -- the fifth --
Line 25, "voltages applied" should read -- applied voltages --
Line 26, "operation" should read -- operations --
Lines 26-27, "far still another" should read -- the fifth --
Line 55, "cell" should read -- cells --
Line 60, delete "consist" after the word "elements"
Line 66, "So that," should read -- In this way, --

Column 6,
Line 9, insert -- the -- after the word "illustrates"
Line 16, "cells" should read -- cell --
Line 18, insert -- the -- after the word "illustrates"
Lines 24-25, "both of the memory cells being connected respectively" after the word "MC53" should read -- are connected continuously between respectively --
Lines 26-27, delete "are provided between the word lines continuously" after the word "WL3"
Line 29, "cell" should read -- cells --
Lines 29-30, "both of the memory cells being connected respectively" after the word "MC53" should read -- are connected continuously between respectively --
Lines 31-32, delete "are provided between the word lines continuously" after the word "WL4"
Line 32, insert -- the -- after the words "both of"
Line 33, "composing" should read -- compose --
Line 52, insert -- S44 -- after the word "and"
Line 58, insert -- to -- after the word "MC54"

UNITED STATES PATENT AND TRADEMARK OFFICE
CERTIFICATE OF CORRECTION

PATENT NO.   : 5,760,437
DATED        : June 2, 1998
INVENTOR(S)  : Shimoji

It is certified that error appears in the above-identified patent and that said Letters Patent is hereby corrected as shown below:

Column 7,
Line 4, insert -- BL5 and BL4, -- after the word "lines"
Line 4, delete "bit lines" after the word "as"
Line 5, "as well as" should read -- by --
Line 8, delete "in the" before the word "above"
Line 8, "a state" should read -- the state --
Lines 9-10, "So that, a" should read --A--
Line 10, delete "accelerated" after the word "the"
Line 10, delete "are" after the word "electrons"
Line 10, "into" should read -- in --
Line 11, "cells" should read -- cell --
Line 11, "by jumping" should read -- are accelerated to jump --
Line 24, "a state" should read -- the state --
Lines 25-26, "So that, the" should read -- The --
Line 27, "pulled out" should read -- are moved --
Line 29, "a state" should read -- the state --
Line 32, delete "in the" after the word "described"
Line 33, "erasion" should read -- erasure --
Line 34, insert -- and -- after the word "Fig. 5),"
Line 36, "So that, application of the" should read -- Application of --
Line 37, "erasion" should read -- erasure --
Line 45, "Vw$\leq$" should read -- Vw$\geq$ --
Line 46, "composing" should read -- comprise --
Line 50, insert -- along -- after the word "WL2,"
Line 51, insert -- of -- after the word "application"
Line 56, insert -- the -- after the word "in"
Line 62, insert -- makes it -- after the word "which"
Line 63, "So that, a" should read -- A --
Lines 64 and 65, "the" should read -- a --

Column 8,
Line 4, "open" should read -- opening --
Line 5, insert -- the -- after the word "to"
Line 9, delete "in the" after the word "described"
Lines 13 and 18, insert -- the -- after the words "is in"
Line 20, "So that, the" should read -- The --
Line 22, "on" should read -- along --
Line 24, insert -- 15 -- after the word "row"

UNITED STATES PATENT AND TRADEMARK OFFICE
CERTIFICATE OF CORRECTION

PATENT NO.   : 5,760,437
DATED        : June 2, 1998
INVENTOR(S)  : Shimoji

It is certified that error appears in the above-identified patent and that said Letters Patent is hereby corrected as shown below:

Column 8 cont'd,
Line 26, insert -- to -- after the word "BL7"
Line 26, insert -- is -- after the word "which"
Line 29, insert -- the -- after the word "in"
Line 31, "So that," should read -- That is, --
Lines 33 and 35, insert -- the-- after the words "is in"
Line 52, insert -- and the present invention -- after the word "examples,"
Line 52, delete "it" after the word "examples,"
Line 52-53, delete "do so in the present invention" after the word "to"
Line 57, "FIGS." should read -- FIG. --
Line 66, insert -- at -- after the word "atmosphere"
Line 66, delete "at" after the word "approximately"
Line 67, "plain" should read -- plan --

Column 9,
Line 1, insert -- the -- after the word "illustrating"
Line 1, insert -- the -- before the word "plane"
Line 7, insert -- the -- after the word "on"
Line 14, delete "to that" after the word "Further"
Line 49, "$5 \times 10^{15}$" should read -- $10^{15}$ --
Line 51, "n" should read -- $n^+$ --
Line 55, insert -- serve -- after the numeral "26"
Line 56, "So that," should read -- In this way, --

Column 10,
Line 13, "actives" should read -- active --
Line 14, "region" should read -- regions --
Line 20, "reach" should read -- reaching --
Line 42, insert -- the -- after the word "cover"
Line 46, "plane" should read -- plan --
Line 48, "connection" should read -- connections --
Line 52, "cell" should read -- cells --
Line 59, "followings" should read -- following --
Line 61, "as well as" should read -- and --

Column 11,
Line 4, delete "that" after the word "So"
Line 9, "plane" should read -- plan --
Line 10, "far another" should read -- a third --
Lines 10 and 11, insert -- a -- after the word "of"

UNITED STATES PATENT AND TRADEMARK OFFICE
CERTIFICATE OF CORRECTION

PATENT NO. : 5,760,437
DATED : June 2, 1998
INVENTOR(S) : Shimoji

It is certified that error appears in the above-identified patent and that said Letters Patent is hereby corrected as shown below:

Column 11 cont'd,
Line 18, "followings" should read --following-
Line 24, "plane" should read --plan --
Line 26, insert -- a -- after the word "of"
Line 32, "followings" should read -- following --
Line 40, "view" should read -- views --
Line 44, "connection" should read -- connections --
Line 48, "being" should read -- are --
Line 48, "by" should read -- as --
Line 50, "followings" should read -- following --
Line 51, "kind" should read -- kinds --

Column 12,
Line 11, "followings" should read -- following --
Line 11, insert -- the -- after the word "Although,"
Line 20, "So that," should read -- As a result, --
Lines 21 and 24, "operation" should read -- operations --
Line 28, "So that, the" should read -- The --
Line 29, "into" should read -- in --
Line 40, insert -- the -- after the word "to"
Line 46, delete "in the" after the word "described"
Lines 50 and 55, insert -- the -- after the words "is in"
Line 57, "show in" should read -- shown --
Lines 59 and 61, "operation" should read -- operations --
Line 65, delete "in the" after the word "described"
Line 67, insert -- a -- after the word "under"

Column 13,
Line 5, delete "in the" after the word "described"
Line 5, "another" should read -- other --
Lines 9-10, "each of which has" should read -- having --
Line 10, "cell" should read -- cells --
Line 11, delete "in the" after the word "described"
Line 12, "to the" should read -- to an --
Line 18, "device" should read -- devices --
Lines 21-22, "line is" should read -- lines are --
Line 29, "So that," should read -- In this way, --
Line 35, delete "the" after the word "between"
Line 36, "line" should read -- lines --
Line 38, insert -- by -- after the word "overlapped"

UNITED STATES PATENT AND TRADEMARK OFFICE
CERTIFICATE OF CORRECTION

PATENT NO. : 5,760,437
DATED : June 2, 1998
INVENTOR(S) : Shimoji

It is certified that error appears in the above-identified patent and that said Letters Patent is hereby corrected as shown below:

Column 13 cont'd,
Line 44, delete "the" after the word "Further,"
Line 49, delete "of" after the word "because"
Lines 53-54, "So that," should read -- Thus, --
Line 58, "region" should read -- regions --
Line 62, insert -- a -- before the word "conductive"
Line 63, "So that, a" should read -- Therefore, --
Line 67, "cell" should read -- cells --

Column 14,
Line 4, insert -- and -- after the word "integration,"
Line 7, "as" should read -- that --
Line 11, delete "so that" after the word "wherein"
Line 13, "So that," should read -- As a result, --

Column 15,
Line 29, "cell" should read -- cells --

Signed and Sealed this

Twenty-fourth Day of June, 2003

JAMES E. ROGAN
*Director of the United States Patent and Trademark Office*